United States Patent
Ogawa et al.

(10) Patent No.: US 10,388,530 B2
(45) Date of Patent: Aug. 20, 2019

(54) METHOD OF MANUFACTURING SEMICONDUCTOR DEVICE AND SUBSTRATE PROCESSING APPARATUS

(71) Applicant: KOKUSAI ELECTRIC CORPORATION, Tokyo (JP)

(72) Inventors: Arito Ogawa, Toyama (JP); Kazuhiro Harada, Toyama (JP); Yukinao Kaga, Toyama (JP); Hideharu Itatani, Toyama (JP); Hiroshi Ashihara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/240,197

(22) Filed: Jan. 4, 2019

(65) Prior Publication Data

US 2019/0157089 A1 May 23, 2019

Related U.S. Application Data

(60) Division of application No. 15/961,277, filed on Apr. 24, 2018, now abandoned, which is a division of (Continued)

(30) Foreign Application Priority Data

Jan. 18, 2013 (JP) .................................. 2013-006965
Jan. 22, 2013 (JP) .................................. 2013-009577
Apr. 16, 2014 (JP) .................................. 2014-005809

(51) Int. Cl.
*H01L 21/28* (2006.01)
*H01L 21/285* (2006.01)
(Continued)

(52) U.S. Cl.
CPC .... *H01L 21/28088* (2013.01); *C23C 16/0272* (2013.01); *C23C 16/36* (2013.01);
(Continued)

(58) Field of Classification Search
None
See application file for complete search history.

(56) References Cited

U.S. PATENT DOCUMENTS

2001/0034123 A1  10/2001  Jeon et al.
2009/0325372 A1  12/2009  Harada
(Continued)

FOREIGN PATENT DOCUMENTS

JP  2001-303251 A  10/2001
JP  2010-034511 A  2/2010
(Continued)

*Primary Examiner* — Jack S Chen
(74) *Attorney, Agent, or Firm* — Volpe and Koenig, P.C.

(57) ABSTRACT

Provided is a technique of adjusting a work function. A method of manufacturing a semiconductor device includes: (a) forming a titanium nitride layer on a substrate by supplying a first source containing titanium and a second source containing nitrogen to the substrate; (b) forming a titanium aluminum carbonitride layer on the substrate by supplying the first source, the second source and a third source containing aluminum and carbon to the substrate; (c) forming a laminated film on the substrate by performing (a) and (b); and (d) adjusting ratios of titanium, nitrogen, aluminum and carbon in the laminated film based on how many times (a) and (b) are performed.

14 Claims, 21 Drawing Sheets

Related U.S. Application Data application No. 14/801,984, filed on Jul. 17, 2015, now abandoned, which is a continuation of application No. PCT/JP2014/050751, filed on Jan. 17, 2014.

(51) Int. Cl.

| | |
|---|---|
| *H01L 49/02* | (2006.01) |
| *H01L 27/108* | (2006.01) |
| *H01L 21/02* | (2006.01) |
| *C23C 16/52* | (2006.01) |
| *C23C 16/455* | (2006.01) |
| *C23C 16/44* | (2006.01) |
| *C23C 16/02* | (2006.01) |
| *C23C 16/36* | (2006.01) |
| *C23C 16/40* | (2006.01) |
| *H01L 29/49* | (2006.01) |
| *H01L 29/51* | (2006.01) |

(52) U.S. Cl.
CPC .......... *C23C 16/402* (2013.01); *C23C 16/405* (2013.01); *C23C 16/4412* (2013.01); *C23C 16/45523* (2013.01); *C23C 16/45531* (2013.01); *C23C 16/45561* (2013.01); *C23C 16/45578* (2013.01); *C23C 16/52* (2013.01); *H01L 21/02181* (2013.01); *H01L 21/28556* (2013.01); *H01L 21/28568* (2013.01); *H01L 27/1085* (2013.01); *H01L 28/40* (2013.01); *H01L 21/28185* (2013.01); *H01L 21/28194* (2013.01); *H01L 21/28562* (2013.01); *H01L 29/4966* (2013.01); *H01L 29/513* (2013.01); *H01L 29/517* (2013.01)

(56) References Cited

U.S. PATENT DOCUMENTS

| | | | |
|---|---|---|---|
| 2012/0049281 | A1 | 3/2012 | Tsuchiya et al. |
| 2012/0261773 | A1 | 10/2012 | Ogawa |
| 2013/0065391 | A1 | 3/2013 | Ogawa et al. |
| 2015/0325447 | A1* | 11/2015 | Ogawa ............ H01L 21/28088 438/680 |
| 2019/0112710 | A1* | 4/2019 | Hiramatsu .......... C23C 16/4586 |

FOREIGN PATENT DOCUMENTS

| | | |
|---|---|---|
| JP | 2011-006783 A | 1/2011 |
| JP | 2011-216846 A | 10/2011 |
| JP | 2012-069942 A | 4/2012 |
| JP | 2012-119432 A | 6/2012 |
| JP | 2012-124215 A | 6/2012 |
| JP | 2012-231123 A | 11/2012 |

* cited by examiner

FIG. 17

| | X | Y | Z | CONCENTRATION (%) | | eWF (eV) on HfO$_2$ |
|---|---|---|---|---|---|---|
| | | | | C | N | |
| FOURTH EXAMPLE | 6 | 1 | 36 | 4.82 | 46.2 | 4.68 |
| FIFTH EXAMPLE | 3 | 1 | 52 | 6.81 | 43.6 | 4.59 |
| SIXTH EXAMPLE | 1 | 1 | 78 | 9.04 | 39.9 | 4.55 |
| SEVENTH EXAMPLE | 0 | 1 | 100 | 11.56 | 36.7 | 4.52 |
| EIGHTH EXAMPLE | 1 | 0 | 340 | 0 | 53.4 | 4.94 |

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application is a divisional of U.S. patent application Ser. No. 15/961,277 filed on Apr. 24, 2018, which is a divisional of U.S. patent application Ser. No. 14/801,984 filed on Jul. 17, 2015, and claims priority under 35 U.S.C. § 119 of Japanese Patent Application No. 2013-006965, filed on Jan. 18, 2013, Japanese Patent Application No. 2013-009577, filed on Jan. 22, 2013, and Japanese Patent Application No. 2014-005809, filed on Jan. 16, 2014, in the Japanese Patent Office, and International Application No. PCT/JP2014/050751, filed on Jan. 17, 2014, in the WIPO, the whole contents of which are hereby incorporated by reference.

BACKGROUND OF THE INVENTION

1. Field of the Invention

The present invention relates to a method of manufacturing a semiconductor device and a substrate processing apparatus.

2. Description of the Related Art

Recently, various metal films have been used as gate electrodes in a gate stack structure. A representative example of a metal gate electrode is titanium nitride (TiN). If a metal gate electrode having a work function different from that of TiN is required, a difficulty level of a process becomes relatively high due to a problem such as process integration (e.g., a processing error, thermal stability, diffusion stability, etc.) when a metal electrode having a different work function different from that of TiN is used. In such a scenario, there is a growing need for a metal film having an adjustable threshold voltage Vth, i.e., a metal film having a tunable (adjustable or modulatable) work function, based on a process of forming a TiN film, since the metal film has affinity with a process in terms of integration with a technique generally used in the art. Also, as semiconductor devices, such as a metal-oxide-semiconductor field effect transistor (MOSFET), have been developed to have a high integration density and high performance, various metal films are used as electrodes, wires, etc. Among the various metal films, a metal carbide-based metal film or a metal nitride-based metal film is generally used as either a gate electrode or a capacitor electrode of a dynamic random access memory (DRAM) in terms of oxidation resistance, electric resistivity, a work function, etc.

RELATED ART DOCUMENT

Patent Document

1. Japanese Unexamined Patent Application Publication No. 2011-216846
2. Japanese Unexamined Patent Application Publication No. 2011-6783

SUMMARY OF THE INVENTION

It is an objective of the present invention to provide a technique of adjusting a work function to a desired level while securing affinity with a process in terms of integration of a technique generally used in the art.

According to one aspect of the present invention, a method of manufacturing a semiconductor device includes:

(a) forming a titanium nitride layer on a substrate by supplying a first source containing titanium and a second source containing nitrogen to the substrate;

(b) forming a titanium aluminum carbonitride layer on the substrate by supplying the first source, the second source and a third source containing aluminum and carbon to the substrate;

(c) forming a laminated film on the substrate by performing (a) and (b); and (d) adjusting ratios of titanium, nitrogen, aluminum and carbon in the laminated film based on how many times (a) and (b) are performed.

BRIEF DESCRIPTION OF THE DRAWINGS

FIG. 17 is a table illustrating the relationship between a ratio between carbon (C) and nitrogen (N) and an effective work function of each of the metal films formed according to Examples 4 to 8.

DETAILED DESCRIPTION OF THE PREFERRED EMBODIMENTS

One of major parameters representing features of a metal-oxide-semiconductor field effect transistor (MOSFET) is a threshold voltage Vth. The threshold voltage Vth is determined by a work function of an electrode. The work function of the electrode may be tuned (adjusted or modulated) using a metal film used to form the electrode. Work functions of a P type transistor and an N type transistor are different from each other. The P type transistor requires a work function of 5.0 eV or more, and the N type transistor requires a work function of 4.3 eV or less. However, the required work functions of the P type transistor and the N type transistor may vary according to a purpose. In this case, the work functions of the transistors are preferably adjusted using one film having a same element composition. According to the present invention, in this case, a work function may be adjusted according to a purpose by controlling, for example, the concentration of carbon (single-phase carbon (C)) in a TiCN film (titanium carbonitride film) having the same element composition. The work function may be adjusted according to a purpose by increasing, for example, the concentration of carbon (C) to decrease the work function.

First Embodiment

Figure 1:
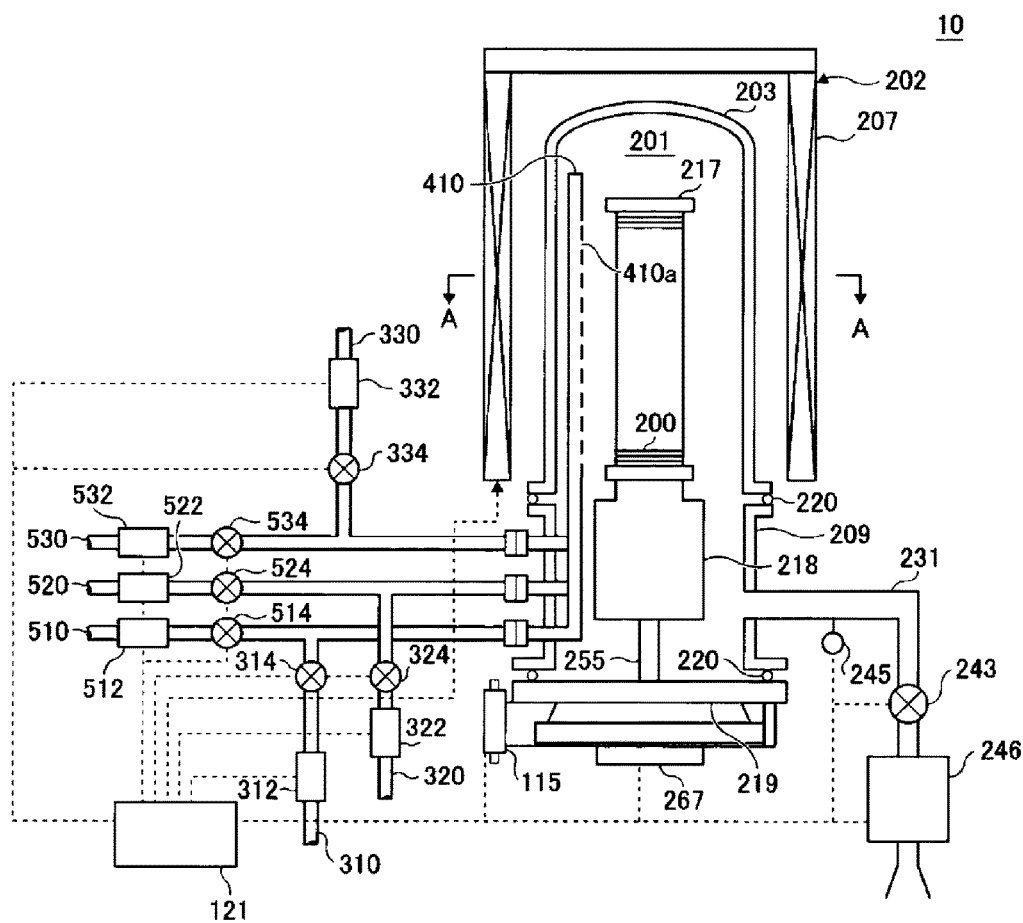
FIG. 1 is a schematic configuration diagram of a vertical process furnace of a substrate processing apparatus according to an embodiment of the present invention, in which a vertical sectional view of a process furnace portion is illustrated.
Figure 2:
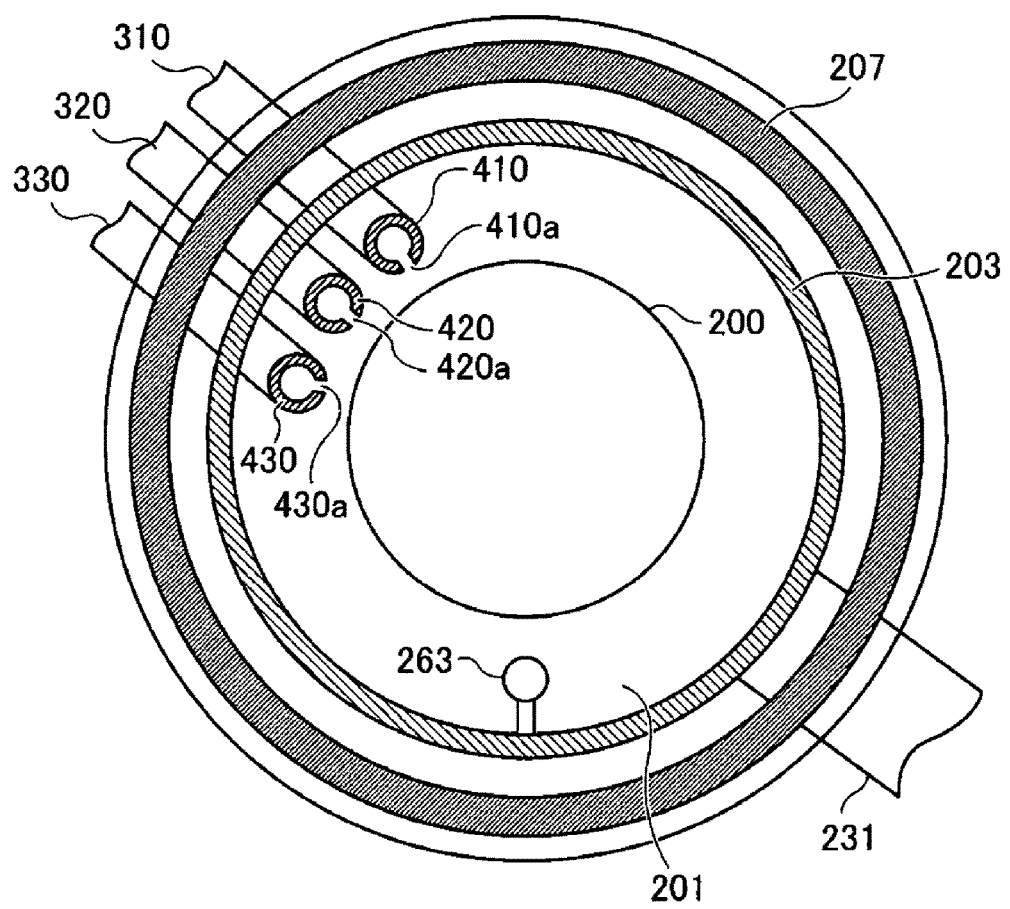
FIG. 2 is a cross-sectional view of the process furnace portion of the vertical process furnace of FIG. 1, taken along line A-A of FIG. 1.

A first embodiment of the present invention will be described based on the accompanying drawings below. FIGS. 1 and 2 illustrate a substrate processing apparatus 10 according to an exemplary embodiment of the present invention. The substrate processing apparatus 10 is embodied as an example of a semiconductor manufacturing apparatus to be used to manufacture a semiconductor device (device).

<Structure of Process Furnace>

As illustrated in FIGS. 1 and 2, a process furnace 202 includes a heater 207 serving as a heating means (a heating mechanism or a heating system) for heating a wafer 200 which is a substrate. The heater 207 includes a cylindrical insulating member, the top of which is blocked, and a plurality of heater wires, and has a unit structure in which the plurality of heater wires are installed with respect to the insulating member. At an inner side of the heater 207, a reaction tube 203 is installed concentrically with the heater 207 to form a reaction container (process container). The reaction tube 203 is formed of, for example, a heat-resistant material such as quartz ($SiO_2$) or silicon carbide (SiC), and has a cylindrical shape, the top end of which is closed and the bottom end of which is open.

A manifold formed of, for example, stainless steel, is installed below the reaction tube 203 via an O-ring 220 which is a sealing member. A low end opening of the manifold 209 is air-tightly closed by a seal cap 219 which is a lid via the O-ring 220. A process chamber 201 includes at least the reaction tube 203, the manifold 209 and the seal cap 219. On the seal cap 219, a boat 217 which is a substrate support means serving as a substrate support means (a substrate support mechanism) is vertically installed via a boat holder 218. The boat holder 218 includes a holder body configured to hold the boat 217 while supporting the boat 217.

A plurality of wafers 200 to be processed in batch are stacked on the boat 217 in a horizontal posture and a multi-stage manner in a tube axial direction. The boat 217 is configured to be moved up or down to (or to access) the reaction tube 203 via a boat elevator 115 serving as a transport means (transfer mechanism). A boat rotating mechanism 267 is installed below the boat holder 218 to improve process uniformity. The boat 217 supported on the boat holder 218 may be rotated by driving the boat rotating mechanism 267. The heater 207 heats wafers 200 inserted into the process chamber 201 to a predetermined temperature.

In the process chamber 201, a nozzle 410 (first nozzle 410), a nozzle 420 (second nozzle 420) and a nozzle 430 (third nozzle 430) are installed to pass through the bottom of the reaction tube 203. A gas supply pipe 310 (first gas supply pipe 310), a gas supply pipe 320 (second gas supply pipe 320) and a gas supply pipe 330 (third gas supply pipe 330) serving as gas supply lines are connected to the nozzle 410, the nozzle 420 and the nozzle 430, respectively. As described above, in the reaction tube 203, three nozzles 410, 420 and 430 and three gas supply pipes 310, 320 and 330 are installed to supply a plurality of types of gases (here, three types of process gases) into the process chamber 201.

At the gas supply pipe 310, a mass flow controller (MFC) 312 which is a flow rate control device (flow rate control unit) and a valve 314 which is an opening/closing valve are sequentially installed from an upstream end. The nozzle 410 is connected to a front end portion of the gas supply pipe 310. The nozzle 410 is configured as an L-shaped long nozzle, the horizontal portion of which passes through a sidewall of the reaction tube 203 and the vertical portion of which is configured to move, in an arc-shaped space between inner walls of the reaction tube 203 and the wafers 200, upward from lower inner walls of the reaction tube 203 in a direction in which the wafers 200 are stacked (i.e., to move from one end of a wafer arrangement region to the other end thereof). That is, the nozzle 410 is installed in a region which horizontally surrounds a side of the wafer arrangement region in which the wafers 200 are arranged and is parallel to the wafer arrangement region.

A plurality of gas supply holes 410a are formed in a side surface of the nozzle 410 to supply a gas. The plurality of gas supply holes 410a are open toward a center of the reaction tube 203. The plurality of gas supply holes 410a are formed from a lower portion of the reaction tube 203 to an upper portion thereof and each have the same opening area (or different opening areas) at the same opening pitch. A first gas supply system mainly includes the gas supply pipe 310, the MFC 312, the valve 314 and the nozzle 410.

A carrier gas supply pipe 510 is connected to the gas supply pipe 310 to supply a carrier gas. At the carrier gas supply pipe 510, an MFC 512 and a valve 514 are installed. A first carrier gas supply system mainly includes the carrier gas supply pipe 510, the MFC 512 and the valve 514.

At the gas supply pipe 320, an MFC 322 which is a flow rate control device (flow rate control unit) and a valve 324 which is an opening/closing valve are sequentially installed from an upstream end. The nozzle 420 is connected to a front end portion of the gas supply pipe 320. The nozzle 420 is configured as an L-shaped long nozzle, the horizontal portion of which passes through a sidewall of the manifold 209 and the vertical portion of which is configured to move, in the arc-shaped space between the inner walls of the reaction tube 203 and the wafers 200, upward from the lower inner walls of the reaction tube 203 in the direction in which the wafers 200 are stacked (i.e., to move from one end of the wafer arrangement region to another end thereof). That is, the nozzle 420 is installed in a region which horizontally surrounds a side of the wafer arrangement region in which the wafers 200 are arranged and is parallel to the wafer arrangement region.

A plurality of gas supply holes 420a are formed in a side surface of the nozzle 420 to supply a gas. The plurality of gas supply holes 420a are open toward the center of the reaction tube 203. The plurality of gas supply holes 420a are formed from the lower portion of the reaction tube 203 to the upper portion thereof and each have the same opening area (or different opening areas) at the same opening pitch. A second gas supply system mainly includes the gas supply pipe 320, the MFC 322, the valve 324 and the nozzle 420.

A carrier gas supply pipe 520 is connected to the gas supply pipe 320 to supply a carrier gas. At the carrier gas supply pipe 520, an MFC 522 and a valve 524 are installed. A second carrier gas supply system mainly includes the carrier gas supply pipe 520, the MFC 522 and the valve 524.

At the gas supply pipe 330, an MFC 332 which is a flow rate control device (flow rate control unit) and a valve 334 which is an opening/closing valve are sequentially installed from an upstream end. The nozzle 430 is connected to a front end portion of the gas supply pipe 330. The nozzle 430 is configured as an L-shaped long nozzle, the horizontal portion of which passes through the sidewall of the manifold 209 and the vertical portion of which is configured to move, in the arc-shaped space between the inner walls of the reaction tube 203 and the wafers 200, upward from the lower inner walls of the reaction tube 203 in the direction in which the wafers 200 are stacked (i.e., to move from one end of the wafer arrangement region to another end thereof). That is, the nozzle 430 is installed in a region which horizontally surrounds a side of the wafer arrangement region in which the wafers 200 are arranged and is parallel to the wafer arrangement region.

A plurality of gas supply holes 430a are formed in a side surface of the nozzle 420 to supply a gas. The plurality of gas supply holes 430a are open toward the center of the reaction tube 203. The plurality of gas supply holes 430a are formed from the lower portion of the reaction tube 203 to the upper portion thereof and each have the same opening area (or different opening areas) at the same opening pitch. A third gas supply system mainly includes the gas supply pipe 330, the MFC 332, the valve 334 and the nozzle 430.

A carrier gas supply pipe 530 is connected to the gas supply pipe 330 to supply a carrier gas. At the carrier gas supply pipe 530, an MFC 532 and a valve 534 are installed. A third carrier gas supply system mainly includes the carrier gas supply pipe 530, the MFC 532 and the valve 534.

As described above, in a gas supply method according to the present embodiment, a gas is transferred via the nozzles 410, 420 and 430 arranged in the arc-shaped space that is vertically long and defined by the inner walls of the reaction tube 203 and end portions of the stacked wafers 200, and is emitted into the reaction tube 203 from the vicinity of the wafers 200 via the gas supply holes 410a, 420b and 430c that are open in the nozzles 410, 420 and 430, thereby causing the gas to flow in the reaction tube 203 mainly in a direction parallel to surfaces of the wafers 200, i.e., a horizontal direction. Since a gas may be uniformly supplied onto the wafers 200 using the above structure, there is an advantage in which a thin film is formed to have a uniform thickness on the wafers 200. After a reaction, a residual gas flows in a direction of an exhaust port, i.e., an exhaust pipe 231 which will be described below but the direction in which the residual gas flows is not limited to a vertical direction and may be appropriately determined by the location of the exhaust port.

As an example of the above structure, for example, titanium tetrachloride ($TiCl_4$) which is a source gas (a titanium (Ti)-containing source which is at least a metal-containing gas (a metal compound) and contains the element titanium (Ti)) is supplied as a first process gas containing a first specific element into the process chamber 201 through the gas supply pipe 310 via the MFC 312, the valve 314 and the nozzle 410. When a liquid source, such as $TiCl_4$ which is in a liquid state at normal temperature and pressure, is used, the liquid source is vaporized using a vaporization system such as a vaporizer or a bubbler and supplied as $TiCl_4$ gas which is a Ti-containing gas.

$Hf[C_5H_4(CH_3)]_2(CH_3)_2$ which is carbon (C)-containing gas (a carbon source) that contains at least the element carbon (C) is supplied as a second process gas containing a second specific element, e.g., a first reactive gas, into the process chamber 201 through the gas supply pipe 320. When a solid source, such as $Hf[C_5H_4(CH_3)]_2(CH_3)_2$ which is in a solid state at normal temperature and pressure, is used, the solid source is heated or melted with a solvent such as ethyl cyclohexane (ECH) or tetrahydrofuran (THF) to a liquid state, and the liquid-state source is vaporized using a vaporization system such as a vaporizer or a bubbler and supplied as a gas.

A second reactive gas, e.g., ammonia ($NH_3$), which is a nitrogen (N)-containing gas that contains at least nitrogen (N) and is a nitriding source, i.e., a nitriding gas, is supplied as a third process gas containing a third specific element into the process chamber 201 through the gas supply pipe 330.

For example, nitrogen ($N_2$) gas is supplied into the process chamber 201 through the carrier gas supply pipes 510, 520 and 530 via the MFCs 512, 522 and 532, the valve 514, 524 and 534, the gas supply pipes 310, 320 and 330, and the nozzles 410, 420 and 430.

For example, when a gas is supplied through each of these gas supply pipes, a source gas supply system is configured with the first gas supply system. The source gas supply system is also referred to as a metal-containing gas supply system. Also, a C-containing gas supply system (carbon source supply system) is configured with the second gas supply system. An N-containing gas supply system (a nitriding source supply system) is configured with the third gas supply system. When a C-containing gas and an N-containing gas are collectively referred to as a reactive gas, a first reactive gas supply system is configured with the C-containing gas supply system and a second reactive gas supply system is configured with the N-containing gas supply system. Also, the source gas supply system, the C-containing gas supply system and the N-containing gas supply system may be simply referred to as a metal source supply system, a carbon source supply system, and a nitriding source supply system, respectively.

The exhaust pipe 231 is installed at the reaction tube 203 to exhaust an atmosphere in the process chamber 201. When viewed from a horizontal cross-section as illustrated in FIG. 2, the exhaust pipe 231 is installed at a side opposite a side at which the gas supply holes 410a of the nozzle 410, the gas supply holes 420a of nozzle 420 and the gas supply holes 430a of the nozzle 430 of the reaction tube 203 are formed, i.e., the exhaust pipe 231 is installed at a side past the wafers 200 and is opposite to the gas supply holes 410a, 420a and 430a. Also, when viewed from a vertical cross-section as illustrated in FIG. 1, the exhaust pipe 231 is installed below the locations of the gas supply holes 410a, 420a and 430a. Due to the above structure, a gas supplied near the wafers 200 in the process chamber via the gas supply holes 410a, 420a and 430a flows in a horizontal direction, i.e., a direction parallel to surfaces of the wafer 200, flows downward, and is then exhausted via the exhaust pipe 231. In the process chamber 201, a gas flows mainly in the horizontal direction as described above.

At the exhaust pipe 231, a pressure sensor 245 serving as a pressure detector (pressure detection unit) for detecting pressure in the process chamber 201, an auto pressure controller (APC) valve 243 serving as an exhaust valve configured as a pressure adjustor (pressure adjustment unit), and a vacuum pump 246 serving as a vacuum exhaust device are sequentially connected from an upstream end. Also, a trapping device that traps reaction byproducts, non-reacted source gas, etc. contained in an exhaust gas or a harm-eliminating device that eliminates a corrosive substance or a toxic substance contained in an exhaust gas may be connected to the exhaust pipe 231. An exhaust system, i.e., an exhaust line, mainly includes the exhaust pipe 231, the APC valve 243 and the pressure sensor 245. The vacuum pump 246 may be further included in the exhaust system. Also, the trapping device or the harm-eliminating device may be further included in the exhaust system.

Vacuum exhausting may be performed or suspended in the process chamber 201 by opening or closing the APC valve 243 while the vacuum pump 246 is operated, and pressure in the process chamber 201 may be controlled by adjusting a degree of openness of the APC valve 243 while the vacuum pump 246 is operated.

In the reaction tube 203, a temperature sensor 263 is installed as a temperature detector. The temperature in the process chamber 201 may be controlled to have a desired temperature distribution by controlling a current supply to be supplied to the heater 207 based on temperature information detected by the temperature sensor 263. The temperature sensor 263 has an L shape similar to the nozzles 410, 420 and 430, and is installed along the inner wall of the reaction tube 203.

Figure 3:
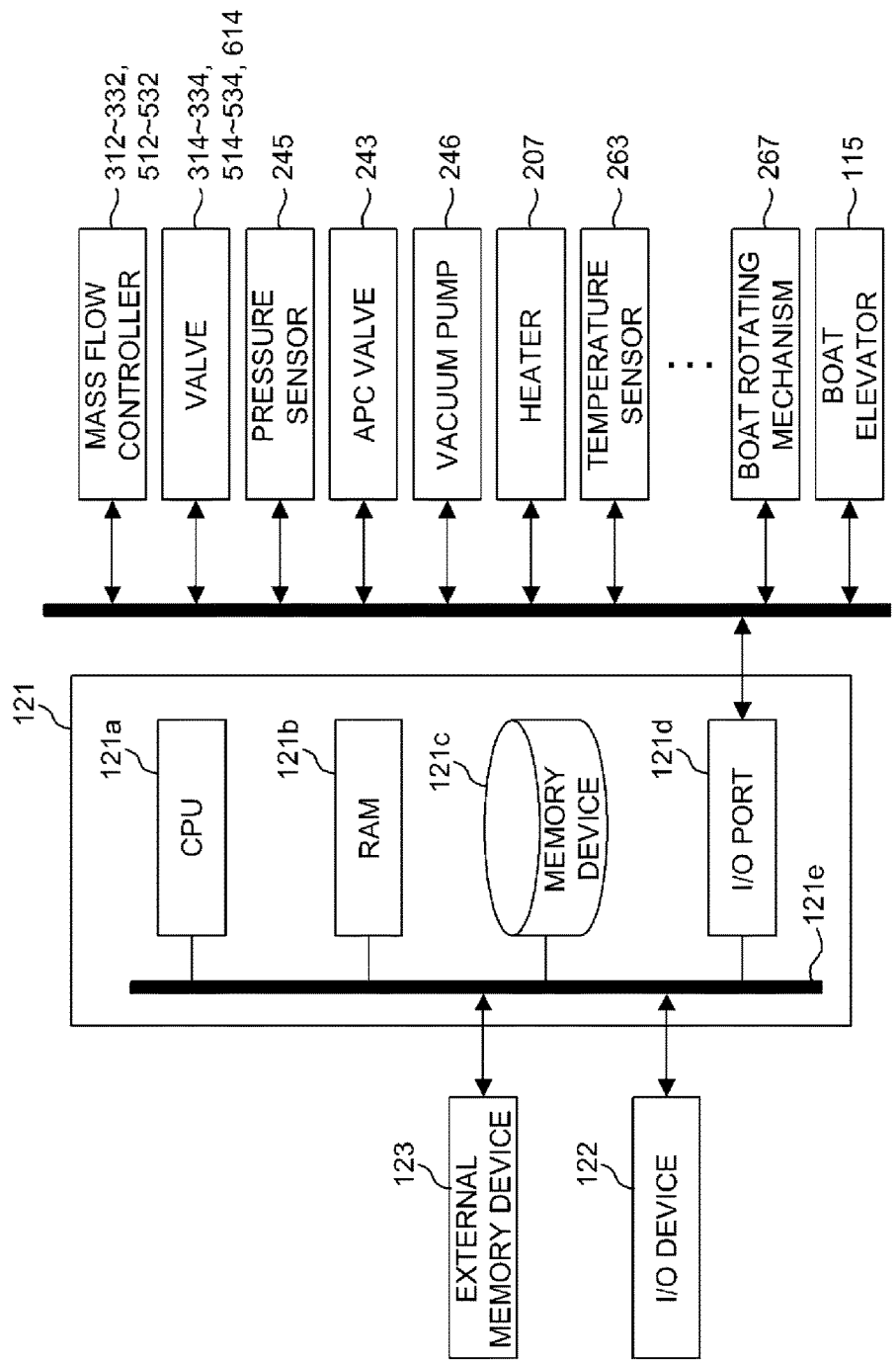
FIG. 3 is a schematic block diagram of a controller included in the substrate processing apparatus of FIG. 1.

A controller 121 is installed in FIG. 3. As illustrated in FIG. 3, the controller 121 is configured as a computer including a central processing unit (CPU) 121a, a random access memory (RAM) 121b, a memory device 121c and an input/output (I/O) port 121d. The RAM 121b, the memory device 121c and the I/O port 121d are configured to exchange data with the CPU 121a via an internal bus 121e. An I/O device 122 configured, for example, as a touch panel or the like is connected to the controller 121.

The memory device 121c is configured, for example, as a flash memory, a hard disk drive (HDD), or the like. In the memory device 121c, a control program for controlling an operation of a substrate processing apparatus, a process recipe including an order or conditions of substrate processing which will be described below, etc. are stored to be readable. The process recipe is a combination of sequences of a substrate processing process which will be described below to obtain a desired result when the sequences are performed by the controller 121, and acts as a program. Hereinafter, the process recipe, the control program, etc. will also be collectively and simply referred to as a 'program.' When the term 'program' is used in the present disclosure, it should be understood as including only the process recipe, only the control program, or both of the process recipe and the control program. The RAM 121b is configured as a memory area (a work area) in which a program or data read by the CPU 121a is temporarily stored.

The I/O port 121d is connected to the MFCs 312, 322, 332, 512, 522 and 532, the valves 314, 324, 334, 514, 524, 534 and 614, the pressure sensor 245, the APC valve 243, the vacuum pump 246, the heater 207, the temperature sensor 263, the boat rotating mechanism 267, the boat elevator 115, etc.

The CPU 121a is configured to read and execute the control program from the memory device 121c and to read the process recipe from the memory device 121c according to a manipulation command received via the I/O device 122. Also, the CPU 121a is configured, based on the read process recipe, to control flow rates of various gases via the MFCs 312, 322, 332, 512, 522 and 532; control opening/closing of the valves 314, 324, 334, 514, 524, 534 and 614; control the degree of pressure by opening/closing the APC valve 243 based on the pressure sensor 245 using the APC valve 243; control temperature of the heater 207 based on the temperature sensor 263; control driving/suspending of the vacuum pump 246; control the rotation and rotation speed of the boat 217 using the boat rotating mechanism 267; control upward/downward movement of the boat 217 using the boat elevator 115, etc.

The controller 121 is not limited to a dedicated computer and may be configured as a general-purpose computer. For example, the controller 121 according to the present embodiment may be configured by preparing an external memory device 123 storing a program as described above, e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory, a memory card, etc.), and then installing the program in a general-purpose computer using the external memory device 123. Also, means for supplying a program to a computer are not limited to using the external memory device 123. For example, a program may be supplied to a computer using communication means, e.g., the Internet or an exclusive line, without using the external memory device 123. The memory device 121c or the external memory device 123 may be configured as a non-transitory computer-readable recording medium. Hereinafter, the memory device 121c and the external memory device 123 may also be collectively and simply referred to as a 'recording medium.' Also, when the term 'recording medium' is used in the present disclosure, it may be understood as including only the memory device 121c, only the external memory device 123, or both the memory device 121c and the external memory device 123.

<Substrate Processing Process>

Next, an example of a process of forming a thin film on the wafer 200 using the process furnace 202 of the substrate processing apparatus described above will be described as a process included in a process of manufacturing a semiconductor device (device). In the following description, operations of various elements of the substrate processing apparatus are controlled by the controller 121.

Figure 4:
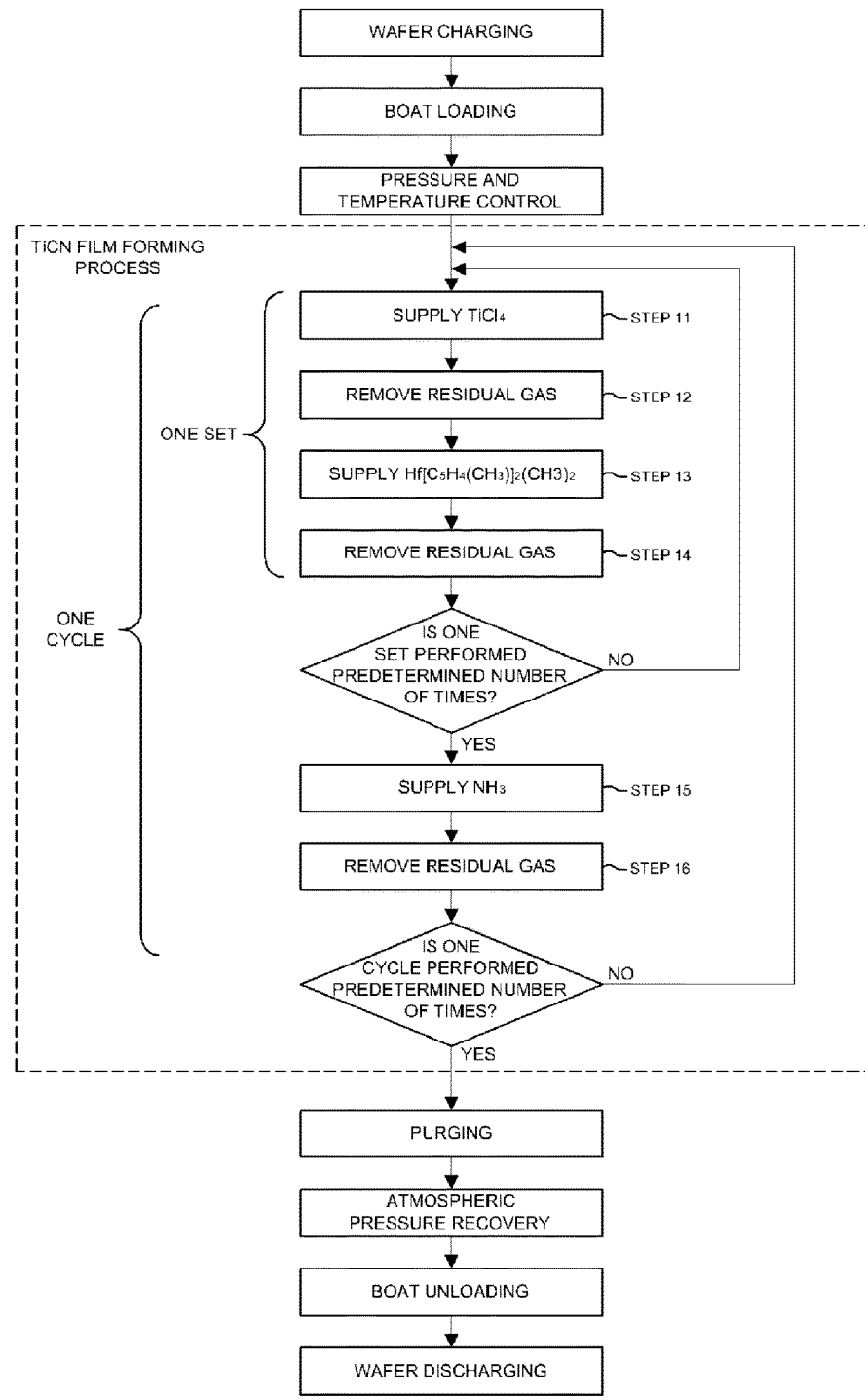
FIG. 4 illustrates a film-forming flow in a sequence of the substrate processing apparatus of FIG. 1 according to a first embodiment of the present invention.
Figure 5:
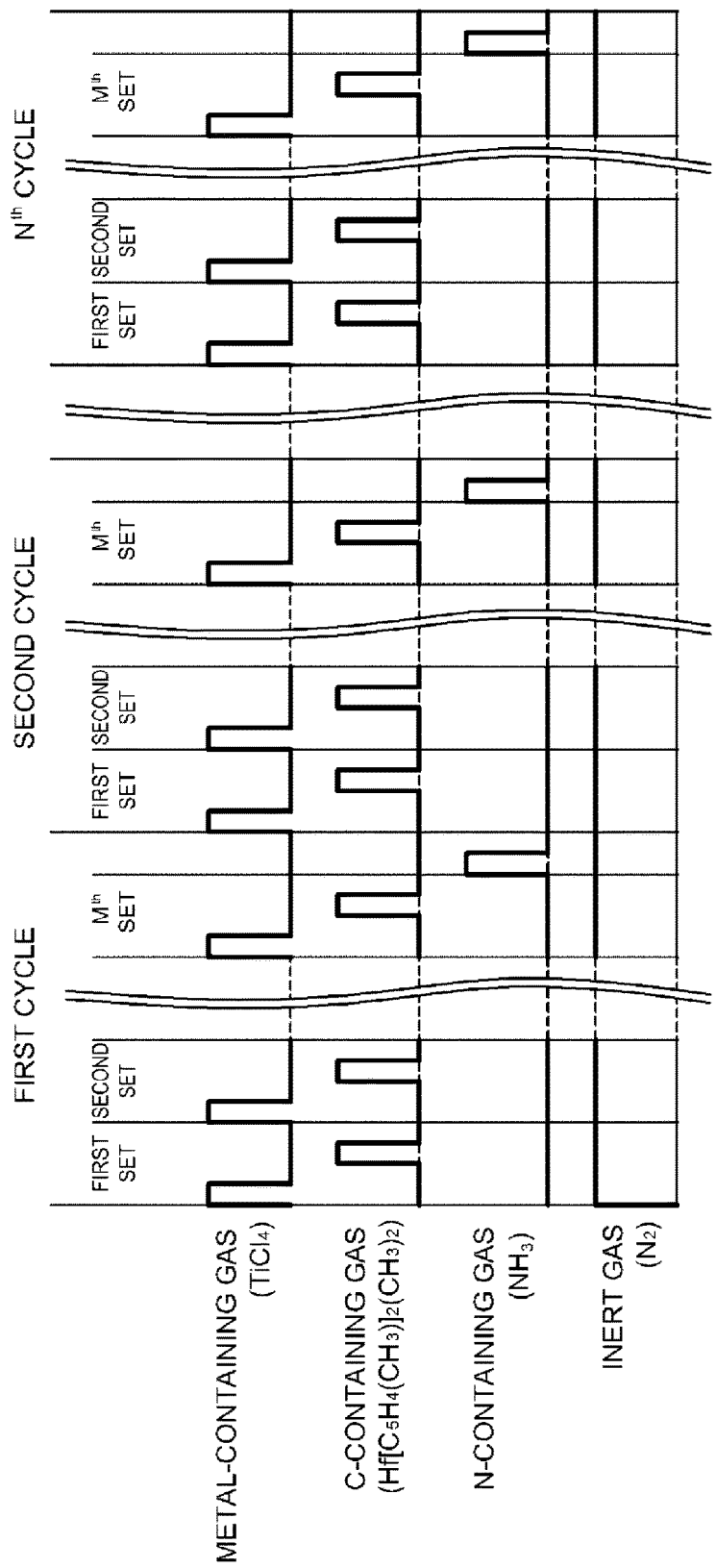
FIG. 5 illustrates gas supply timing based on the sequence of FIG. 4 according to the first embodiment.

FIG. 4 illustrates a film-forming flow in an exemplary sequence according to the present embodiment. FIG. 5 illustrates gas supply timing based on the sequence of FIG. 4 according to the present embodiment.

In the exemplary sequence according to the present embodiment, a metal carbonitride film (a TiCN film) is formed on the wafer 200 to a predetermined thickness by alternately performing (a) the formation of a metal carbide layer (a TiC layer) as a first layer containing titanium and carbon on the wafer 200 by supplying a titanium (Ti)-containing gas and a carbon (C)-containing gas onto the wafer 200 M times; and (b) the formation of a metal carbonitride layer (a TiCN layer) as a second layer containing titanium, carbon and nitrogen by supplying a nitrogen (N)-containing gas onto the wafer 200 N times to nitride the metal carbide layer (the TiC layer). The number of times the nitrogen (N)-containing gas is supplied onto the wafer 200 in the forming of the metal carbonitride layer (the TiCN layer), i.e., N times, and the number of times the titanium (Ti)-containing gas and the carbon (C)-containing gas are supplied onto the wafer 200 in the forming of the metal carbide layer (the TiC layer), i.e., M times, are determined (adjusted, tuned, or modulated) such that the metal carbonitride film (the TiCN film) has a desired work function. Here, "M" and "N" each denote a natural number.

When the term 'wafer' is used in the present disclosure, it should be understood as either the wafer itself, or both the wafer and a stacked structure (assembly) including a layer/film formed on the wafer (i.e., the wafer and the layer/film formed thereon may also be collectively referred to as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression "specific gas is supplied onto a wafer" should be understood to mean that the specific gas is directly supplied onto a surface (exposed surface) of the wafer or that the specific gas is supplied onto a surface of a layer/film on the wafer, i.e., on the uppermost surface of the wafer as a stacked structure. Also, in the present disclosure, the expression 'a layer (or film) is formed on the wafer' should be understood to mean that the layer (or film) is directly formed on a surface (exposed surface) of the wafer itself or that the layer (or film) is formed on the layer/film on the wafer, i.e., on the uppermost surface of the wafer as a stacked structure.

Also, in the present disclosure, the term 'substrate' has the same meaning as the term 'wafer.' Thus, the term 'wafer' may be used interchangeably with the term 'substrate.'

The expression "supplying of a metal-containing gas and carbon (C)-containing gas are performed M times" should be understood to include, when the supplying of the metal-containing gas and the supplying of the carbon-containing gas are set to one set, performing the set once (i.e., M=1) or performing the set a plurality of times (i.e., M=2 or more). That is, this expression means that the set is performed once or more. The set is preferably performed a plurality of times to obtain a TiCN film having a relatively high concentration of carbon (C). The greater the number of times the set is performed, the higher the concentration of carbon (C) in the TiCN film. The set is preferably performed a small number of times, e.g., only once, to obtain a TiCN film having a relatively low concentration of carbon (C).

The expression "alternately performing the formation of a TiC layer and the formation of a TiCN layer" should be understood to include, when "a process of forming a TiC layer containing Ti and C on the wafer 200 by supplying a Ti-containing gas and a C-containing gas onto the wafer 200 in the process chamber 201 M times" and "a process of forming a TiCN layer containing Ti, C and N by supplying a N-containing gas onto the wafer 200 N times to nitride the TiC layer" are set to one cycle, performing the cycle once or performing the cycle a plurality of times. That is, this expression means that the cycle is performed once or more (a predetermined number of times). As will be described below, the cycle is preferably performed a plurality of times.

Also, in the present disclosure, the term 'metal film' means a film formed of a conductive material including a metal atom, and should be understood to include a conductive metal film formed of a metal, a conductive metal nitride film, a conductive metal oxide film, a conductive metal oxynitride film, a conductive metal composite film, a conductive metal alloy film, a conductive metal silicide film, a conductive metal carbide film, a conductive metal carbonitride film, etc. Also, a TiCN film (titanium carbonitride film) is a conductive metal carbonitride film.

(Wafer Charging and Boat Loading)

When a plurality of wafers 200 are placed on the boat 217 (wafer charging), the boat 217 supporting the plurality of wafers 200 is lifted by the boat elevator 115 and loaded into the process chamber 201 (boat loading), as illustrated in FIG. 1. In this state, the lower end of the reaction tube 203 is air-tightly closed by the seal cap 219 via the O-ring 220.

(Pressure & Temperature Control)

The inside of the process chamber 201 is vacuum-exhausted to have a desired pressure (degree of vacuum) by the vacuum pump 246. In this case, the pressure in the process chamber 201 is measured by the pressure sensor 245, and the APC valve 243 is feedback-controlled based on information regarding the measured pressure (pressure control). The operation of the vacuum pump 246 is maintained at least until processing of the wafers 200 is completed. Also, the inside of the process chamber 201 is heated to a desired temperature by the heater 207. In this case, a current supply supplied to the heater 207 is feedback-controlled based on temperature information detected by the temperature sensor 263, so that the inside of the process chamber 201 may have a desired temperature distribution (temperature control). The heating of the inside of the process chamber 201 by the heater 207 is continuously performed at least until the processing of the wafers 200 is completed. Then, rotation of the boat 217 and the wafers 200 begins due to the boat rotating mechanism 267. Also, the rotation of the boat 217 and the wafers 200 by the boat rotating mechanism 267 is continuously performed at least until the processing of the wafers 200 is completed. Thereafter, six steps which will be described below are sequentially performed.

<Step 11>

(TiCl$_4$ Gas Supply Process)

TiCl$_4$ gas is supplied into the gas supply pipe 310 by opening the valve 314 of the gas supply pipe 310. The flow rate of the TiCl$_4$ gas flowing in the gas supply pipe 310 is adjusted by the MFC 312. The flow rate-adjusted TiCl$_4$ gas is supplied into the process chamber 201 via the gas supply holes 410a of the nozzle 410, and exhausted via the exhaust pipe 231. In this case, the TiCl$_4$ gas is supplied onto the wafer 200. That is, a surface of the wafer 200 is exposed to the TiCl$_4$ gas. At the same time, the valve 514 is opened to supply an inert gas, such as N$_2$ gas, into the carrier gas supply pipe 510. The flow rate of the N$_2$ gas flowing in the carrier gas supply pipe 510 is adjusted by the MFC 512. The flow rate-adjusted N$_2$ gas is supplied into the process chamber 201 together with the TiCl$_4$ gas, and exhausted via the exhaust pipe 231. Also, in this case, the valves 524 and 534 are opened to supply N$_2$ gas into the carrier gas supply pipe 520 and the carrier gas supply pipe 530 so as to prevent the TiCl$_4$ gas from flowing into the nozzles 420 and 430. The N$_2$ gas is supplied into the process chamber 201 via the gas supply pipe 320, the gas supply pipe 330, the nozzle 420 and nozzle 430, and exhausted via the exhaust pipe 231.

In this case, the APC valve 243 is appropriately adjusted to set the pressure in the process chamber 201 to be within, for example, a range of 10 to 2,000 Pa. The supply flow rate of the $TiCl_4$ gas controlled by the MFC 512 is set to be within, for example, a range of 10 to 2,000 sccm. The supply flow rates of the $N_2$ gas controlled by the MFCs 512, 522 and 532 are set to be within, for example, a range of 100 to 10,000 sccm. A duration for which the $TiCl_4$ gas is supplied onto the wafer 200, i.e., a gas supply time (irradiation time), is set to be within, for example, a range of 0.1 to 120 seconds. In this case, the temperature of the heater 207 is set such that the temperature of the wafer 200 is within, for example, a range of 200 to 400° C. When the temperature of the wafer 200 is less than 200° C., a TiC layer formed by sequentially performing Steps 11 to 14 a predetermined number of times and a TiCN layer formed and $NH_3$ supplied in Step 15 do not react with each other, thereby preventing a TiCN layer from being formed in Step 15. When the temperature of the wafer 200 is greater than 400° C., a gas-phase reaction is dominant, and film thickness uniformity is likely to be degraded and may thus be difficult to control. Thus, the temperature of the wafer 200 is preferably set to be within a range of 200° C. to 400° C. When the $TiCl_4$ gas is supplied, a titanium (Ti)-containing layer that contains chlorine (Cl), i.e., a layer that contains Ti and Cl, is formed on the wafer 200. The titanium (Ti)-containing layer that contains chlorine (Cl) may be a chemical adsorption layer of $TiCl_4$ and an intermediate of $TiCl_4$ obtained when $TiCl_4$ is decomposed, a titanium (Ti) layer containing Cl and obtained when $TiCl_4$ is pyrolyzed, i.e., a Ti-deposited layer, or both of these layers.

<Step 12>
(Residual Gas Removing Process)
After the Ti-containing layer that contains Cl is formed, the valve 314 of the gas supply pipe 310 is closed to stop the supply of the $TiCl_4$ gas. In this case, the inside of the process chamber 201 is vacuum-exhausted by the vacuum pump 246 in a state in which the APC valve 243 of the exhaust pipe 231 is open, thereby eliminating the $TiCl_4$ gas (that did react or that contributed to the formation of the Ti-containing layer that contains Cl) remaining in the process chamber 201 from the process chamber 201. In this case, $N_2$ gas is continuously supplied into the process chamber 201 while the valves 514, 524 and 534 are open. The $N_2$ gas acts as a purge gas to increase the effect of eliminating the $TiCl_4$ gas (that did not react or that contributed to the formation of the Ti-containing layer that contains Cl) remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 13 to be performed thereafter will not be badly influenced by the gas. In this case, the flow rate of the $N_2$ gas to be supplied into the process chamber 201 does not need to be high. For example, the inside of the process chamber 201 may be purged without causing step 13 to be badly influenced by the gas by supplying an amount of a gas corresponding to the capacity of the reaction tube 203 (the process chamber 201). As described above, since the inside of the process chamber 201 is not completely purged, a purge time may be reduced to improve the throughput. Furthermore, the consumption of the $N_2$ gas may be suppressed to a necessary minimum level.

<Step 13>
($Hf[C_5H_4(CH_3)]_2(CH_3)_2$ Gas Supply Process)
After Step 12 is completed and a residual gas is removed from the inside of the process chamber 201, the valve 324 of the gas supply pipe 320 is opened to supply $Hf[C_5H_4(CH_3)]_2(CH_3)_2$ gas into the gas supply pipe 320. The flow rate of the $Hf[C_5H_4(CH_3)]_2(CH_3)_2$ gas flowing in the gas supply pipe 320 is adjusted by the MFC 322. The flow rate-adjusted $Hf[C_5H_4(CH_3)]_2(CH_3)_2$ gas is supplied into the process chamber 201 via the gas supply hole 420a of the nozzle 420, and exhausted via the exhaust pipe 231. In this case, the $Hf[C_5H_4(CH_3)]_2(CH_3)_2$ gas is supplied onto the wafer 200. That is, a surface of the wafer 200 is exposed to the $Hf[C_5H_4(CH_3)]_2(CH_3)_2$ gas. At the same time, the valve 524 is opened to supply $N_2$ gas into the carrier gas supply pipe 520. The flow rate of the $N_2$ gas flowing in the carrier gas supply pipe 520 is adjusted by the MFC 522. The flow rate-adjusted $N_2$ gas is supplied into the process chamber 201, together with the $Hf[C_5H_4(CH_3)]_2(CH_3)_2$ gas, and exhausted via the exhaust pipe 231. In this case, the valves 514 and 534 are opened to supply $N_2$ gas into the carrier gas supply pipe 510 and the carrier gas supply pipe 530 so as to prevent the $Hf[C_5H_4(CH_3)]_2(CH_3)_2$ gas from flowing into the nozzles 410 and 430. The $N_2$ gas is supplied into the process chamber 201 via the gas supply pipe 310, the gas supply pipe 330 and the nozzles 410 and 430, and exhausted via the exhaust pipe 231.

In this case, the APC valve 243 is appropriately adjusted to set the pressure in the process chamber 201 to be within, for example, a range of 10 to 2,000 Pa, similar to Step 11. The supply flow rate of the $Hf[C_5H_4(CH_3)]_2(CH_3)_2$ gas adjusted by the MFC 322 is set to be within, for example, a range of 10 sccm to 2,000 sccm. The supply flow rate of the $N_2$ gas adjusted by the MFC 522 is set to be within, for example, a range of 100 sccm to 10,000 sccm. A duration for which the $Hf[C_5H_4(CH_3)]_2(CH_3)_2$ gas is supplied onto the wafer 200, i.e., a gas supply time (irradiation time), is set to be within, for example, a range of 0.1 to 120 seconds. In this case, the temperature of the heater 207 is set such that the temperature of the wafer 200 is within, for example, a range of 250 to 400° C., similar to Step 11.

When the $Hf[C_5H_4(CH_3)]_2(CH_3)_2$ gas is supplied, the Ti-containing layer containing Cl formed on the wafer 200 reacts with the $Hf[C_5H_4(CH_3)]_2(CH_3)_2$ gas in Step 11. In this case, mainly in Step 11, Cl contained in the Ti-containing layer containing Cl formed on the wafer 200 reacts with $Hf[C_5H_4(CH_3)]_2$ of the $Hf[C_5H_4(CH_3)]_2(CH_3)_2$ gas to form a gas-phase material, and the gas-phase material is then discharged as a gas. In this case, Cl contained in the Ti-containing layer that contains Cl may react with a methyl group ($CH_3$) or a cyclopenta group ($C_5H_4$) in the $Hf[C_5H_4(CH_3)]_2(CH_3)_2$ gas. In this case, as $Hf[C_5H_4(CH_3)]_2(CH_3)_2$ is decomposed, hafnium (Hf), hydrogen (H), etc. contained in $Hf[C_5H_4(CH_3)]_2(CH_3)_2$ may react with Cl contained in the Ti-containing layer that contains Cl to form a gas-phase material and the gas-phase material may be then discharged as a gas. As described above, in Step 13, Cl contained in $TiCl_4$ and Hf contained in $Hf[C_5H_4(CH_3)]_2(CH_3)_2$ are converted into a gas-phase material and then the gas-phase material is discharged. That is, Cl contained in $TiCl_4$ and Hf contained in $Hf[C_5H_4(CH_3)]_2(CH_3)_2$ are converted into a gas-phase material containing Cl and a gas-phase material containing Hf and/or a gas-phase material containing Cl and Hf, and then the gas-phase materials or the gas-phase material is discharged. Thus, Hf does not actually remain in a film to be formed. Also, an effect of eliminating Cl from a film to be formed may increase according to a synergistic effect. During this process, C separated from a bond between C and H or a part of a separated methyl group ($CH_3$) as the Hf[C$_5$H$_4$(CH$_3$)]$_2$(CH$_3$)$_2$ gas is decomposed is not discharged as a gas, and remains and is bonded with Ti contained in the Ti-containing layer that contains Cl. Thus, the Ti-containing layer that contains Cl is modified into a titanium carbide layer (TiC layer) that contains titanium (Ti) and carbon (C).

<Step 14>

(Residual Gas Removing Process)

Thereafter, the valve 324 of the gas supply pipe 320 is closed to stop the supply of the Hf[C$_5$H$_4$(CH$_3$)]$_2$(CH$_3$)$_2$ gas. In this case, the inside of the process chamber 201 is vacuum-exhausted by the vacuum pump 246 in a state in which the APC valve 243 of the exhaust pipe 231 is open, thereby eliminating the Hf[C$_5$H$_4$(CH$_3$)]$_2$(CH$_3$)$_2$ gas (that did react or that contributed to the formation of the TiC layer) or byproducts remaining in the process chamber 201 from the process chamber 201. In this case, N$_2$ gas is continuously supplied into the process chamber 201 while the valves 510, 520 and 530 are open. The N$_2$ gas acts as a purge gas to increase the effect of eliminating the Hf[C$_5$H$_4$(CH$_3$)]$_2$(CH$_3$)$_2$ gas (that did not react or that contributed to the formation of the TiC layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 11 or 15 to be performed thereafter will not be badly influenced by the gas. In this case, the flow rate of the N$_2$ gas to be supplied into the process chamber 201 does not need to be high. For example, the inside of the process chamber 201 may be purged without causing step 11 or 15 to be badly influenced by the gas by supplying an amount of a gas corresponding to the capacity of the reaction tube 203 (the process chamber 201). As described above, since the inside of the process chamber 201 is not completely purged, a purge time may be reduced to improve the throughput. Furthermore, the consumption of the N$_2$ gas may be suppressed to a necessary minimum level.

Then, Steps 11 to 14 described above are set to one set, and the set is performed a predetermined number of times (M times) to form a TiC layer to a predetermined thickness. FIG. 5 illustrates a case in which the set is performed m times. The number of times the set is performed, i.e., m times, may be set to be in a range of 1 to 200, preferably, a range of 1 to 100, and more preferably, a range of 1 to 20. The number of times, i.e., m times, that the set is performed may be, for example, a plurality of times, i.e., two times to six times. By controlling (adjusting) the number of times (m times) that the set is performed, the concentration of C in a TiCN film to be finally formed may be controlled. A work function of the TiCN film may be adjusted (tuned) to a desired level according to a purpose by changing the concentration of C. To obtain a TiCN film having a relatively high concentration of C, the set is preferably performed a plurality of times. The concentration of C in the TiCN film may be increased by increasing the number of times a set is performed. To obtain a TiCN film having a relatively low concentration of C, the number of times (m times) that the set is performed is preferably set to a small number of times (e.g., once).

<Step 15>

(NH$_3$ Gas Supply Process)

After the TiC layer is formed to the predetermined thickness and a residual gas is removed from the inside of the process chamber 201, the valve 334 of the gas supply pipe 330 is opened to supply NH$_3$ gas into the gas supply pipe 330. The flow rate of the NH$_3$ gas flowing in the gas supply pipe 330 is adjusted by the MFC 322. The flow rate-adjusted NH$_3$ gas is supplied into the process chamber 201 via the gas supply holes 430a of the nozzle 430. The NH$_3$ gas supplied into the process chamber 201 is activated by heat and exhausted via the exhaust pipe 231. In this case, the thermally activated NH$_3$ gas is supplied onto the wafer 200. That is, a surface of the wafer 200 is exposed to the thermally activated NH$_3$ gas. At the same time, the valve 534 is opened to supply N$_2$ gas into the carrier gas supply pipe 530. The flow rate of the N$_2$ gas flowing in the carrier gas supply pipe 530 is adjusted by the MFC 532. The N$_2$ gas is supplied into the process chamber 201, together with the NH$_3$ gas, and exhausted via the exhaust pipe 231. In this case, the valves 514 and 524 are opened to supply N$_2$ gas into the carrier gas supply pipes 510 and 520 so as to prevent the NH$_3$ gas from flowing into the nozzles 410 and 420. The N$_2$ gas is supplied into the process chamber 201 via the gas supply pipes 310 and 320 and the nozzles 410 and 420, and exhausted via the exhaust pipe 231.

When the NH$_3$ gas is activated by heat and supplied, the APC valve 243 is appropriately controlled such that the pressure in the process chamber 201 is in, for example, a range of 10 Pa to 2,000 Pa. By setting the pressure in the process chamber 201 to a relatively high level as described above, the NH$_3$ gas may be thermally activated in a non-plasma state. When the NH$_3$ gas is activated by heat and supplied, a soft reaction may occur to softly perform a nitriding action which will be described below. The supply flow rate of the NH$_3$ gas controlled by the MFC 332 is set to be within, for example, a range of 10 sccm to 10,000 sccm. The supply flow rates of the N$_2$ gas controlled by the MFCs 512, 522 and 532 are set to be in, for example, a range of 100 sccm to 10,000 sccm. A duration for which the NH$_3$ gas activated by heat is supplied onto the wafer 200, i.e., a gas supply time (irradiation time), is set to range, for example, from 0.1 to 120 seconds. In this case, the temperature of the heater 207 is set such that the temperature of the wafer 200 is within, for example, a range of 200° C. to 400° C., similar to Steps 11 and 13.

In this case, the thermally activated NH$_3$ gas is supplied into the process chamber 201 by increasing the pressure in the process chamber 201, and neither TiCl$_4$ gas nor Hf[C$_5$H$_4$(CH$_3$)]$_2$(CH$_3$)$_2$ gas is not supplied into the process chamber 201. Thus, the NH$_3$ gas does not cause a gas-phase reaction, and the activated NH$_3$ gas reacts with at least a part of the TiC layer containing Ti and C and formed on the wafer 200 in Step 13. Thus, the TiC layer is nitrided and modified into a titanium carbonitride layer (a TiCN layer). The TiCN layer may be also referred to as a C-doped TiN layer (a C-added TiN layer).

When the TiC layer is thermally nitrided to be modified (changed) into a TiCN layer by the thermally activated NH$_3$ gas, the TiC layer is modified into a TiCN layer while adding nitrogen (N) to the TiC layer. In this case, a number of Ti-N bonds increase in the TiC layer due to an action of thermal nitridation caused by the NH$_3$ gas. That is, the TiC layer may be modified into the TiCN layer while changing a composition ratio of the TiC layer to increase the concentration of nitrogen therein. Also, in this case, by controlling a process condition such as the pressure in the process chamber 201 or a gas supply time, a ratio of nitrogen (N) (i.e., the concentration of nitrogen (N)) in the TiCN layer may be finely adjusted, thereby more finely controlling a composition ratio of the TiCN layer.

<Step 16>
(Residual Gas Removing Process)

Then, the valve 334 of the gas supply pipe 330 is closed to stop the supply of the $NH_3$ gas. In this case, the inside of the process chamber 201 is vacuum-exhausted by the vacuum pump 246 in a state in which the APC valve 243 of the exhaust pipe 231 is open to eliminate the $NH_3$ gas (that did react or that contributed to the formation of the TiCN layer) or byproducts remaining in the process chamber 201 from the process chamber 201. In this case, $N_2$ gas is continuously supplied into the process chamber 201 while the valves 514, 524 and 534 are open. The $N_2$ gas acts as a purge gas to increase the effect of eliminating the $NH_3$ gas (that did not react or that contributed to the formation of the TiCN layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, Step 11 to be performed thereafter will not be badly influenced by the gas. In this case, the flow rate of the $N_2$ gas to be supplied into the process chamber 201 does not need to be high. For example, the inside of the process chamber 201 may be purged without causing Step 11 to be badly influenced by the gas by supplying an amount of a gas corresponding to the capacity of the reaction tube 203 (the process chamber 201). As described above, since the inside of the process chamber 201 is not completely purged, a purge time may be reduced to improve the throughput. Furthermore, the consumption of the $N_2$ gas may be suppressed to a necessary minimum level.

Thereafter, a cycle including a process of sequentially performing Steps 11 to 14 a predetermined number of times and a process of performing Steps 15 and 16 is performed a predetermined number of times to form a TiCN film having a predetermined composition ratio on the wafer 200 to a predetermined thickness. The TiCN film may be also referred to as a C-doped TiN film (C-added TiN film). FIG. 5 illustrates a case in which the cycle is performed n times. By controlling (adjusting) the number of times (n times) that the cycle is performed, a film thickness of a TiCN film to be finally formed may be adjusted. For example, in order to form a TiCN film for a gate electrode, which has a concentration of C of 10 at % to 30 at % and a film thickness of 1 nm to 10 nm, the n times the cycle is performed is set to be within a range of one to five times. The cycle is preferably performed a plurality of times. That is, a thickness of a TiCN layer to be formed per cycle may be set to be less than a desired thickness and the cycle may be performed a plurality of times until the TiCN layer may have the desired thickness. As described above, when a thickness of the TiCN layer to be formed per cycle is set to be less than the desired thickness and the cycle is repeatedly performed a plurality of times, an action of nitridation performed in Step 15 may be delivered to the entire TiC layer. Also, the TiCN film may be more uniformly nitrided to more uniformly control the concentration of N in the TiCN film in a direction of the thickness thereof.

(Purging and Atmospheric Pressure Recovery)

After the TiCN film having the predetermined composition ratio and film thickness is formed, an inert gas such as $N_2$ is supplied into the process chamber 201 and exhausted via the exhaust pipe 231 to purge the inside of the process chamber 201 with the inert gas (gas purging). Thereafter, an atmosphere in the process chamber 201 is replaced with the inert gas (inert gas replacement), and the pressure in the process chamber 201 is restored to normal pressure (atmospheric pressure recovery).

(Boat Unloading and Wafer Discharging)

Then, the seal cap 219 is moved downward by the boat elevator 115 to open the lower end of the reaction tube 203, and the processed wafers 200 are unloaded to the outside of the reaction tube 203 from the lower end of the reaction tube 203 while being supported by the boat 217 (boat unloading). Thereafter, the processed wafers 200 are unloaded from the boat 217 (wafer discharging).

Although a case in which $Hf[C_5H_4(CH_3)]_2(CH_3)_2$ gas is used as a carbon source has been described above in the above embodiment, the present invention is not limited thereto, and $Zr[C_5H_4(CH_3)]_2(CH_3)_2$ gas, ethylene ($C_2H_4$), propylene ($C_3H_6$), butene ($C_4H_8$), pentene ($C_5H_{10}$), hexene ($C_6H_{12}$), heptene ($C_7H_{14}$) octene ($C_8H_{16}$), ethane ($C_2H_6$), propane ($C_3H_8$), butane ($C_4H_{10}$), pentane ($C_5H_{12}$), hexane ($C_6H_{14}$), heptane ($C_7H_{16}$), octane ($C_8H_{18}$), etc. may be used as a carbon source.

Second Embodiment

Next, a second embodiment of the present invention will be described. In the first embodiment, a case in which a TiCN film is formed on the wafer 200 to a predetermined thickness has been described above. Similarly, in the second embodiment, a titanium aluminum carbide film (TiAlC film) may be formed on the wafer 200 to a predetermined thickness, for example, by supplying three types of gases. Here, the differences between the first embodiment and the second embodiment will be described in detail, and a description of parts of the second embodiment that are the same as those of the first embodiment will be appropriately omitted.

Figure 6:
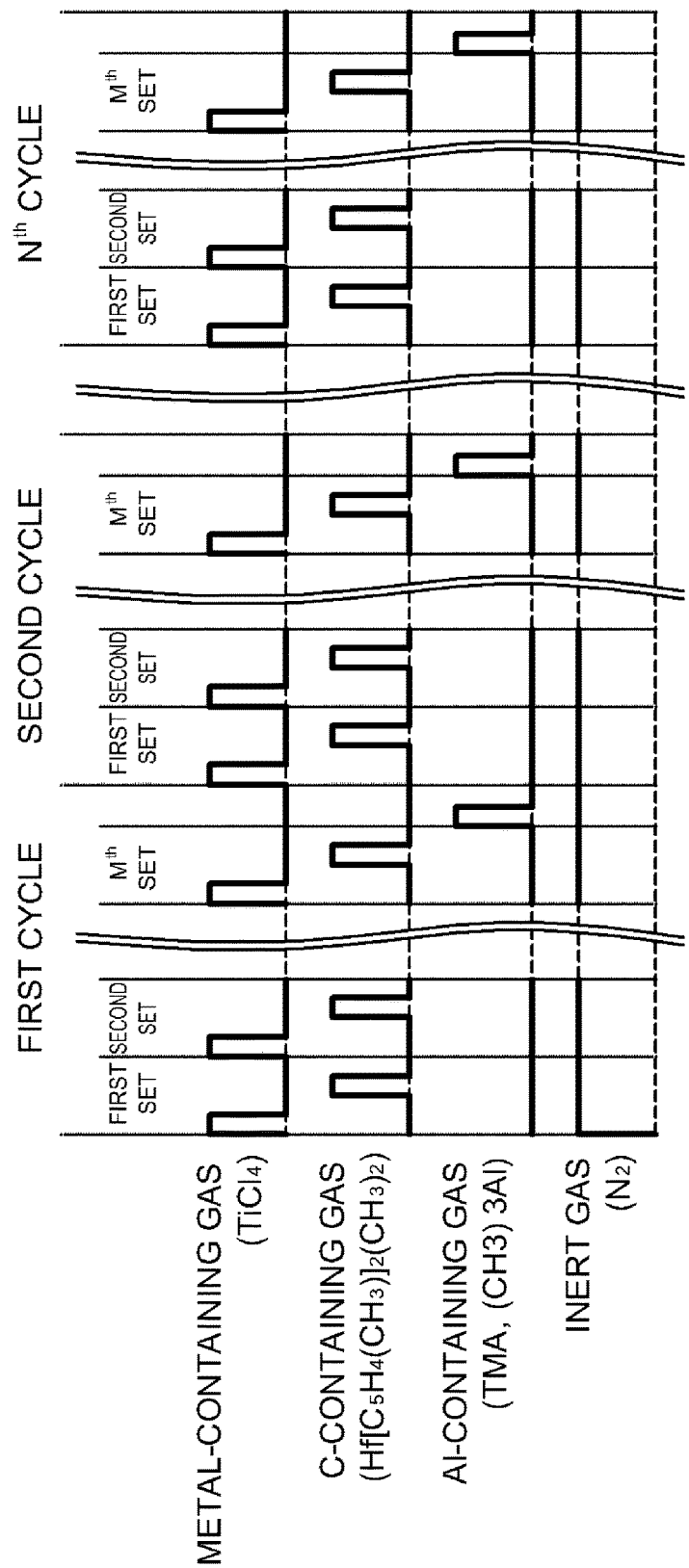
FIG. 6 illustrates gas supply timing in a sequence according to a second embodiment of the present invention.

FIG. 6 illustrates gas supply timing in a favorable sequence of forming a TiAlC film by supplying three types of gases onto the wafer 200. In the gas supply timing of FIG. 6, one set including a process of alternately supplying titanium tetrachloride ($TiCl_4$) gas (which is a titanium (Ti)-containing gas) and carbon (C)-containing gas onto the wafer 200 is repeatedly performed, and a number of times (m times) that the set is performed is controlled to control the concentration of C in a TiAlC film to be finally formed, thereby adjusting (tuning) a work function of the TiAlC film.

More specifically, a TiAlC film may be formed to a predetermined thickness according to a sequence of (a) forming a titanium carbide layer (TiC layer) containing titanium (Ti) and carbon (C) on the wafer 200 by alternately supplying titanium tetrachloride ($TiCl_4$) gas which is a titanium (Ti)-containing gas and carbon (C)-containing gas onto the wafer 200 in the process chamber 201 M times; and (b) forming a titanium aluminum carbide layer (TiAlC layer) containing titanium (Ti), carbon (C) and aluminum (Al) by supplying trimethylaluminum [TMA, $(CH_3)_3Al$] as an Al-containing gas which is a metal source gas containing aluminum (Al) on the wafer 200 in the process chamber 201 N times. A titanium aluminum carbide film (TiAlC film) is formed on the wafer 200 to a predetermined thickness by alternately performing L times (a) the formation of a titanium carbide layer (TiC layer) and (b) the formation of a titanium aluminum carbide layer (TiAlC layer). The M times in (a) and the N times in (b) are determined (adjusted, tuned, or modulated) such that the TiAlC film has a desired work function (M, N, and L each denote a natural number).

(Third Embodiment)

Figure 7:
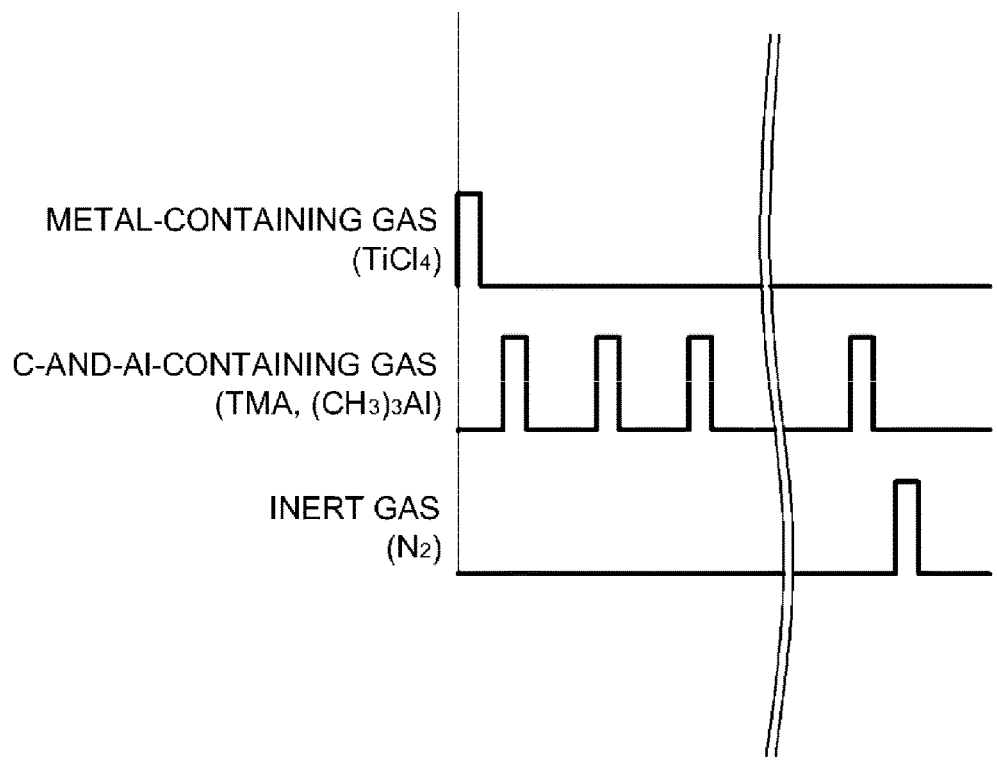
FIG. 7 illustrates gas supply timing in a sequence according to a third embodiment of the present invention.

Next, a third embodiment of the present invention will be described. Although a case in which three types of gases are used to form a TiAlC film has been described above in the second embodiment, the present invention is not limited thereto and a TiAlC film may be formed using two types of process gases. FIG. 7 illustrates gas supply timing in a favorable sequence of forming a TiAlC film by supplying two types of gases onto the wafer 200. Here, the differences between the third embodiment and the first and second embodiments and the second embodiment will be described in detail, and a description of parts of the third embodiment that are the same as those of the first and second embodiments will be appropriately omitted.

In the gas supply timing of FIG. 7, a TiAlC film may be formed on the wafer 200 to a predetermined thickness according to the following sequence. A TiAlC layer containing Ti, Al and C is formed on the wafer 200 by alternately performing (a) the supply of $TiCl_4$ gas as a Ti-containing gas on the wafer 200 in the process chamber 201 M times; and (b) the supply of TMA gas as a source containing C and Al N times. In this case, a work function of the TiAlC film is adjusted (tuned) based on the ratio between the M times in (a) and the N times in (b).

In this case, the greater the N times in (b), the higher the concentration of C in the TiAlC film. As the concentration of C increases, the work function of the TiAlC film decreases. Also, the less the N times in (b) (e.g., the N times may be one), the lower the concentration of C in TiAlC film. As the concentration of C decreases, the work function of the TiAlC film increases.

Although a case in which TMA gas which is an Al-containing gas is used as a metal source gas has been described above in the previous embodiment of forming a TiAlC film, the present invention is not limited thereto and $AlCl_3$ or the like may be used.

Also, although cases in which a TiCN film or a TiAlC film have been described above in the previous embodiments, the present invention is not limited thereto and is preferably applicable to forming a metal carbide film containing at least one metal element selected from the group consisting of tantalum (Ta), cobalt (Co), tungsten (W), molybdenum (Mo), ruthenium (Ru), yttrium (Y), lanthanum (La), zirconium (Zr), and hafnium (Hf) or also forming a silicide film containing the at least one metal element and silicon (Si). In this case, tantalum tetrachloride ($TaCl_4$), etc. may be used as a Ta-containing source. Co amd $[(tBu)NC(CH_3)N(tBu)_2Co]$, etc. may be used as a Co-containing source. Tungsten hexafluoride ($WF_6$), etc. may be used as a W-containing source. Molybdenum chloride ($MoCl_3$ or $MoCl_5$), etc. may be used as a Mo-containing source. 2,4-dimethyl-pentadienyl(ethylcyclopentadienyl)ruthenium [Ru(EtCp)($C_7H_{11}$)], etc. may be used as a Ru-containing source. Tris(ethylcyclopentadienyl)yttrium [Y($C_2H_5C_5H_4$)$_3$], etc. may be used as a Y-containing source. Tris(isopropylcyclopentadienyl)lanthanum [La(i-$C_3H_7C_5H_4$)$_3$], etc. may be used as a La-containing source. Tetrakis(ethylmethylamino)zirconium [Zr(N[$CH_3(C_2H_5)$]$_4$)], etc. may be used as a Zr-containing source. Tetrakis(ethylmethylamino)hafnium [Hf(N[$CH_3(C_2H_5)$]$_4$)], etc. may be used as an Hf-containing source. Tetrachlorosilane ($SiCl_4$), hexachlorosilane ($Si_2Cl_6$), dichlorosilane ($SiH_2Cl_2$), tris(dimethylamino)silane (SiH[N($CH_3$)$_2$]$_3$, bis-tertiary-butyl aminosilane ($H_2Si$[HNC($CH_3$)$_2$]$_2$, etc. may be used as a Si-containing source.

Next, a fourth embodiment of the present invention will be described. Although a case in which a TiCN film is formed on the wafer 200 to a predetermined thickness has been described above in the first embodiment, a titanium aluminum carbonitride film (TiAlCN film) may be formed on the wafer 200 to a predetermined film thickness, for example, by supplying three types of gases in the fourth embodiment. Here, the differences between the fourth embodiment and the first embodiment and the second embodiment will be described in detail, and a description of parts of the fourth embodiment that are the same as those of the first embodiment will be appropriately omitted.

Unlike the first embodiment, for example, TMA [trimethylaluminum, ($CH_3$ $_3$)Al] containing at least elements of carbon (C) and aluminum (Al) is supplied as a source gas containing carbon and a second metal element into the process chamber 201 through the gas supply pipe 320 via the MFC 322, the valve 324 and nozzle 420. When a liquid source, such as TMA, which is in a liquid state at normal temperature and pressure, is used, the liquid source is vaporized using a vaporization system such as a vaporizer or a bubbler and supplied as a C-and-Al-containing gas. A carbon-containing source supply system (or carbon-and-metal-containing source supply system) is configured with the second gas supply system.

Next, an example of the structure of a semiconductor device according to the present embodiment will be described. Here, MOSFET will be exemplified as a semiconductor device.

Figure 8:
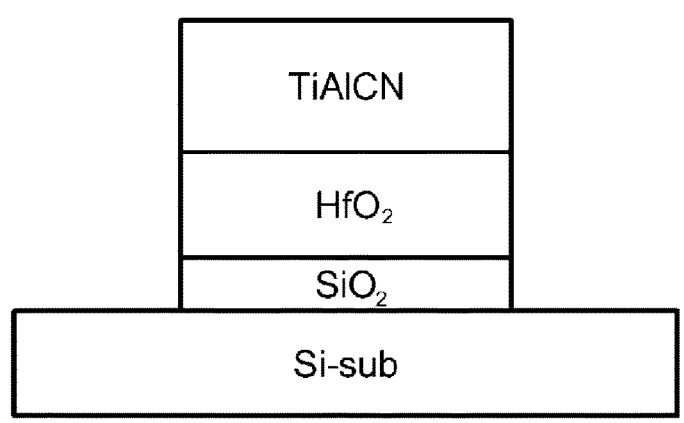
FIG. 8 illustrates the structure of a semiconductor device according to a fourth embodiment of the present invention.

FIG. 8 illustrates the structure of a gate of a MOSFET. As illustrated in FIG. 8, the gate of the MOSFET has a stack structure in which a silicon-based insulating film formed of silicon oxide ($SiO_2$) and formed on a silicon (Si) substrate, a high-k film formed of hafnium oxide ($HfO_2$) and formed on the silicon oxide ($SiO_2$), and a titanium aluminum carbonitride (TiAlCN) film formed on the hafnium oxide ($HfO_2$) are stacked as metal films for a gate electrode. The present embodiment is characterized in forming the metal films that constitute the gate electrode.

<Process of Manufacturing Gate of Semiconductor Device>

Figure 9:
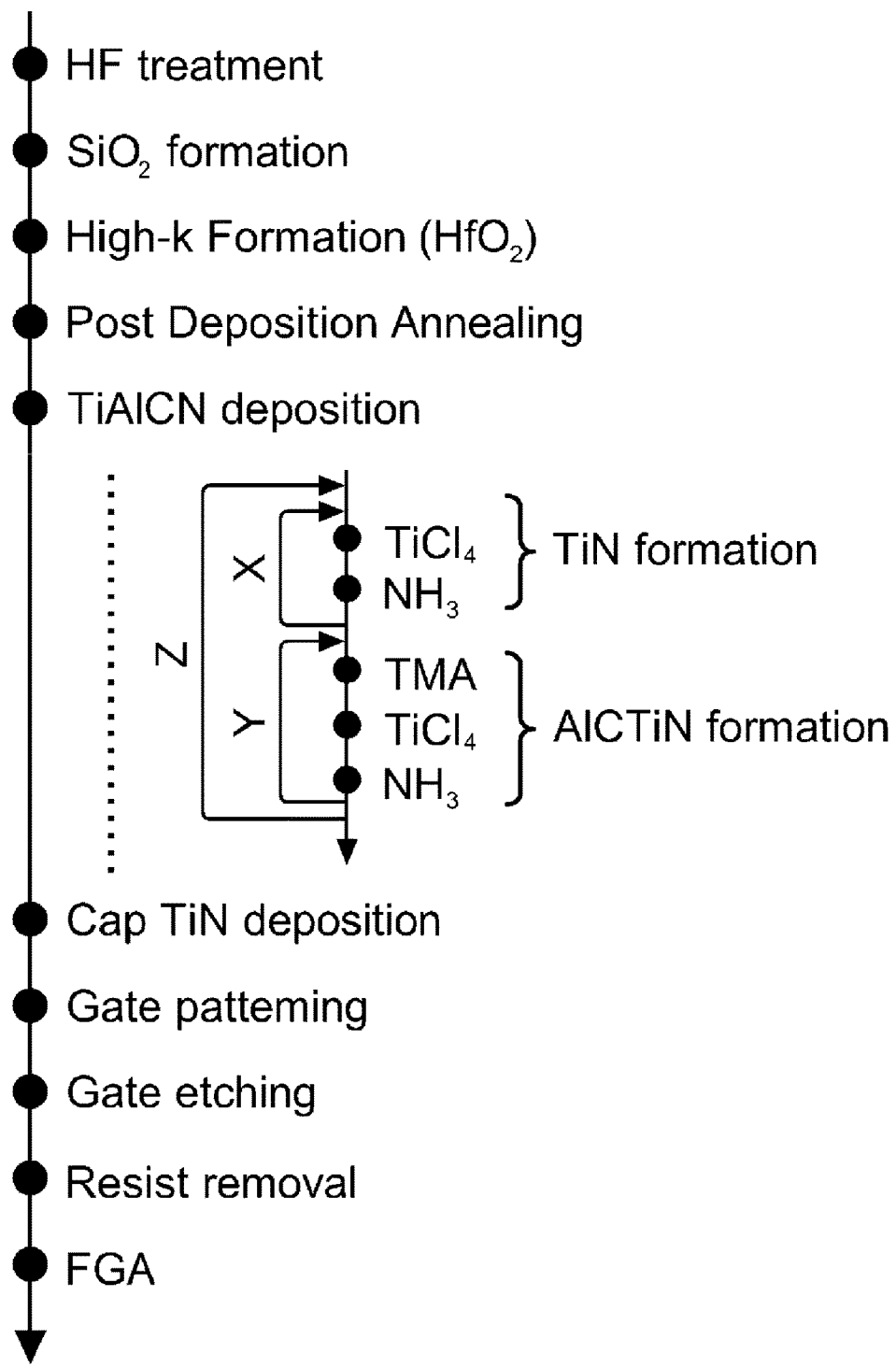
FIG. 9 is a flowchart of a process of manufacturing a gate of the semiconductor device of FIG. 8 according to an embodiment of the present invention.

Next a process of manufacturing the gate of the MOSFET of FIG. 8 will be described with reference to FIG. 9 below. FIG. 9 is a flowchart of a process of manufacturing a gate of the semiconductor device of FIG. 8 according to an embodiment of the present invention.

First, a silicon (Si) substrate is processed with, for example, a 1% HF aqueous solution to remove a sacrificial oxide film of the Si-substrate ('HF treatment' process). Then, a silicon oxide ($SiO_2$) film is formed on a surface of the Si-substrate through thermal oxidation ('$SiO_2$ formation' process). The $SiO_2$ film is formed as an interface layer at the interface between the Si-substrate and an $HfO_2$ film which will be formed later.

Next, a hafnium oxide ($HfO_2$) film is formed as a high-k film on the $SiO_2$ film ('high-k formation' process). The $SiO_2$ film and the $HfO_2$ film form a gate insulating film. After the $HfO_2$ film is formed, post-deposition annealing (PDA) is performed ("post-deposition annealing' process). PDA is performed by accommodating the Si-substrate on which the $HfO_2$ film is formed in a process chamber of a thermal process furnace, e.g., a rapid thermal process (RTP) device, and supplying $N_2$ gas into the process chamber. PDA is performed to remove impurities from the $HfO_2$ film and to densify or crystallize the $HfO_2$ film.

Next, a TiAlCN film is formed as a metal film on the $HfO_2$ film ('TiAlCN deposition' process). As illustrated in FIG. 9, in a process of forming the TiAlCN film, a treatment of forming a titanium nitride (TiN) layer (first layer) ('TiN formation') is performed X times (M times), and a treatment of forming an AlCTiN layer (second layer) containing aluminum (Al), carbon (C), titanium (Ti) and nitrogen (N) ('AlCTiN formation') is performed Y times (N times).

Thereafter, a TiAlCN is formed by alternately performing these treatments Z times (L times), as will be described in detail below.

Then, a titanium nitride (TiN) film is formed as a cap film on the TiAlCN film, for example, by physical vapor deposition (PVD) ('cap TiN deposition' process). Then, a gate electrode is patterned on the TiN film using a resist as a mask by photolithography ('gate patterning' process), and is etched by dry etching ('gate etching' process). Then, the resist is removed ('resist removal' process). Then, forming gas annealing (FGA), such as hydrogen gas annealing, is performed (forming gas annealing) ('FGA' process).

<Metal Film Forming Process>

Next, a process of forming metal films that constitute the gate electrode described above will be described. The process of forming metal films is performed, as a process included in a process of manufacturing a semiconductor device (e.g., a MOSFET), using the process furnace 202 of the substrate processing apparatus 10 described above.

A preferable sequence according to the present embodiment includes a process of forming a metal film including nitrogen (N) and carbon (C) in a predetermined ratio (e.g., a TiAlCN film) on the wafer 200 by alternately performing L times the formation of a first layer (e.g., a TiN layer) containing a metal element (e.g., Ti) and nitrogen (N) on the wafer 200 M times and the formation of a second layer (e.g., an AlCTiN layer) containing the metal element (e.g., Ti), nitrogen (N) and carbon (C) on the wafer 200 N times (M, N, and L each denote a natural number).

Also, a preferable sequence according to the present embodiment includes a process of forming a metal film (e.g., a TiAlCN film) containing nitrogen (N) and carbon (C) in a predetermined ratio on the wafer 200 by alternately performing L times the alternately supplying of a first source (e.g., $TiCl_4$) containing a metal element (e.g., Ti) and a second source (e.g., $NH_3$) containing nitrogen (N) onto the wafer 200 M times and the alternately supplying of a third source (e.g., TMA) containing carbon (C), a fourth source (e.g., $TiCl_4$) containing the metal element (e.g., Ti), and a fifth source (e.g., $NH_3$) containing nitrogen (N) onto the wafer 200 N times.

In the present embodiment, the M times, the N times and the L times are determined by the ratio of nitrogen (N) or carbon (C) in a metal film (e.g., the TiAlCN film) (in other words, a target work function of the gate electrode). Also, the TiAlCN film (titanium aluminum carbonitride film) is a conductive metal carbonitride film.

Figure 10:
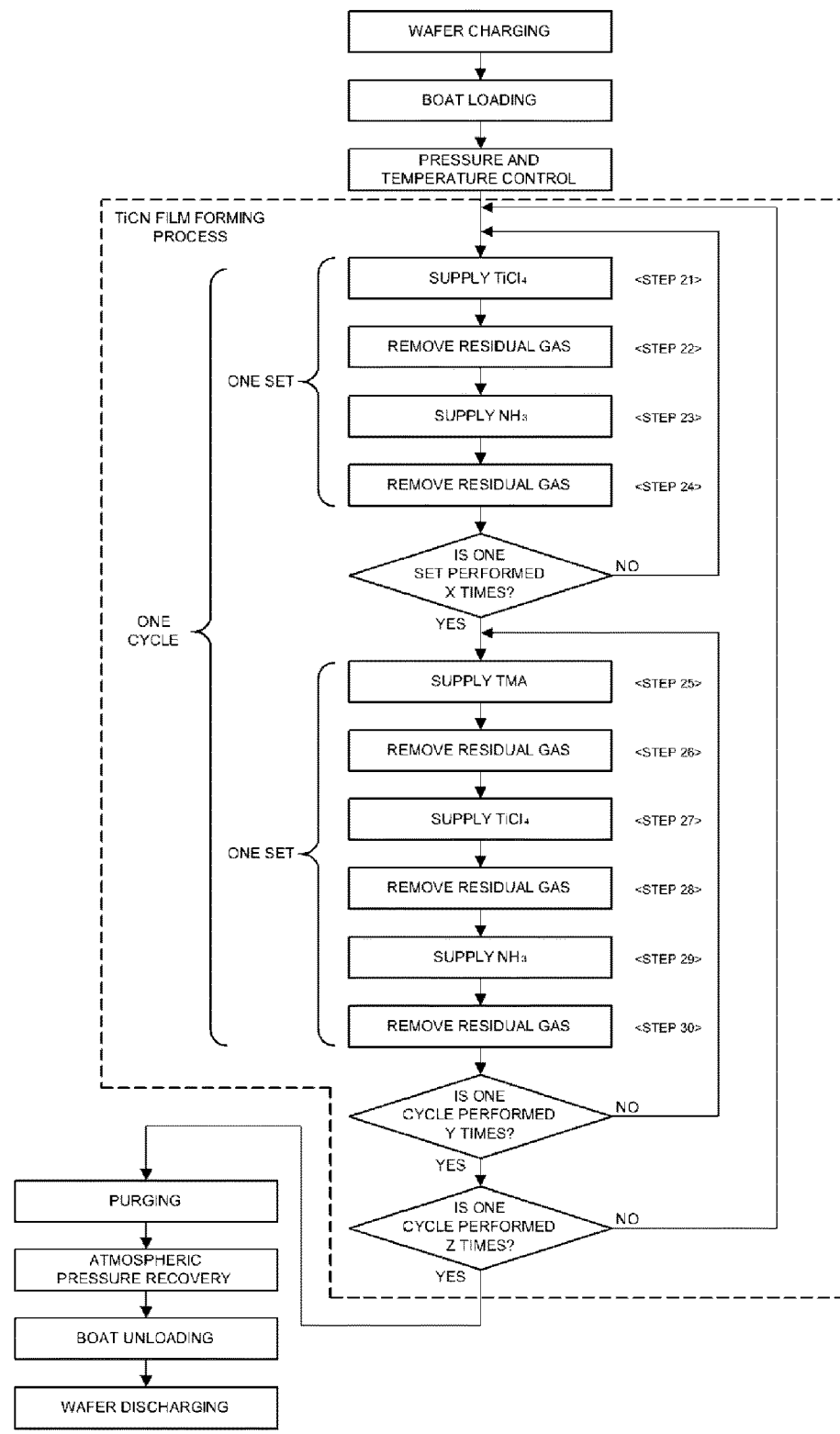
FIG. 10 is a flowchart of a metal-film forming process included in the process of manufacturing the gate of FIG. 9.
Figure 11:
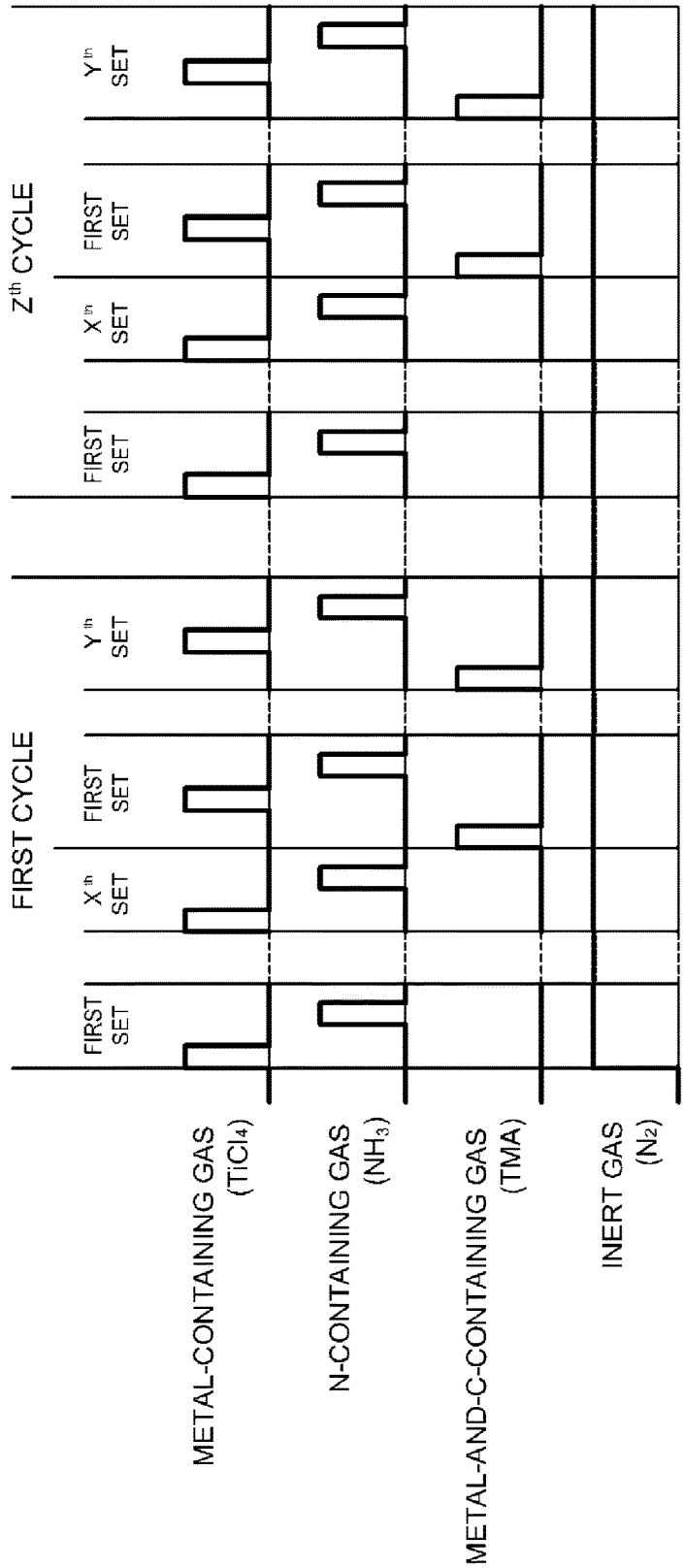
FIG. 11 illustrates gas supply timing in the metal-film forming process of FIG. 10.

FIG. 10 is a flowchart of a process of forming a metal film (TiAlCN film), which is included in the flow of the process of manufacturing a gate of FIG. 9. FIG. 11 illustrates gas supply timing in the process of forming a metal film of FIG. 10. In the following description, operations of various elements of the substrate processing apparatus 10 are controlled by the controller 121.

(Wafer Charging and Boat Loading)

When a plurality of wafers 200 are placed on the boat 217 (wafer charging), the boat 217 supporting the plurality of wafers 200 is lifted by the boat elevator 115 and loaded into the process chamber 201 (boat loading), as illustrated in FIG. 1. In this state, the lower end of the reaction tube 203 is air-tightly closed by the seal cap 219 via the O-ring 220.

(Pressure & Temperature Control)

The inside of the process chamber 201 is vacuum-exhausted to have a desired pressure (degree of vacuum) by the vacuum pump 246. In this case, the pressure in the process chamber 201 is measured by the pressure sensor 245, and the APC valve 243 is feedback-controlled based on information regarding the measured pressure (pressure control). The operation of the vacuum pump 246 is maintained at least until processing of the wafers 200 is completed. Also, the inside of the process chamber 201 is heated to a desired temperature by the heater 207. In this case, a current supply supplied to the heater 207 is feedback-controlled based on temperature information detected by the temperature sensor 263, so that the inside of the process chamber 201 may have a desired temperature distribution (temperature control). The heating of the inside of the process chamber 201 by the heater 207 is continuously performed at least until the processing of the wafers 200 is completed. Then, rotation of the boat 217 and the wafers 200 begins due to the boat rotating mechanism 267. The rotation of the boat 217 and the wafers 200 by the boat rotating mechanism 267 is continuously performed at least until the processing of the wafers 200 is completed.

Next, a process of forming a TiN layer (Steps 21 to 24) is performed.

<Step 21>

($TiCl_4$ Gas Supply Process)

The valve 314 of the gas supply pipe 310 is opened to supply $TiCl_4$ gas as a first source into the gas supply pipe 310. The flow rate of the $TiCl_4$ gas flowing in the gas supply pipe 310 is adjusted by the MFC 312. The flow rate-adjusted $TiCl_4$ gas is supplied into the process chamber 201 via the gas supply holes 410a of the nozzle 410, and exhausted via the exhaust pipe 231. In this case, the $TiCl_4$ gas is supplied onto the wafer 200. That is, a surface of the wafer 200 is exposed to the $TiCl_4$ gas. At the same time, the valve 514 is opened to supply an inert gas such as $N_2$ gas into the carrier gas supply pipe 510. The flow rate of the $N_2$ gas flowing in the carrier gas supply pipe 510 is adjusted by the MFC 512. The flow rate-adjusted $N_2$ gas is supplied into the process chamber 201 together with the $TiCl_4$ gas, and exhausted via the exhaust pipe 231. In this case, the valves 524 and 534 are opened to supply $N_2$ gas into the carrier gas supply pipe 520, carrier gas supply pipe 530 so as to prevent the $TiCl_4$ gas from flowing into the nozzles 420 and 430. The $N_2$ gas is supplied into the process chamber 201 via the gas supply pipe 320, the gas supply pipe 330 and the nozzles 420 and 430, and exhausted via the exhaust pipe 231.

In this case, the APC valve 243 is appropriately adjusted to set the pressure in the process chamber 201 to be within, for example, a range of 1 to 10,000 Pa. The supply flow rate of the $TiCl_4$ gas controlled by the MFC 312 is set to be within, for example, a range of 10 to 10,000 sccm. The supply flow rates of the $N_2$ gas controlled by the MFCs 512, 522 and 532 are set to be within, for example, a range of 10 to 10,000 sccm. A duration for which the $TiCl_4$ gas is supplied onto the wafer 200, i.e., a gas supply time (irradiation time), is set to be within, for example, a range of 0.1 to 120 seconds. In this case, the temperature of the heater 207 is set such that the temperature of the wafer 200 is within, for example, a range of 200 to 500° C. When the $TiCl_4$ gas is supplied, a Ti-containing layer is formed on the wafer 200 to, for example, a thickness of less than one atomic layer to several atomic layers.

<Step 22>

(Residual Gas Removing Process)

After the Ti-containing layer is formed, the valve 314 of the gas supply pipe 310 is closed to stop the supply of the $TiCl_4$ gas. In this case, the inside of the process chamber 201 is vacuum-exhausted by the vacuum pump 246 in a state in which the APC valve 243 of the exhaust pipe 231 is open, thereby eliminating the $TiCl_4$ gas (that did react or that contributed to the formation of the Ti-containing layer that contains Cl) remaining in the process chamber 201 from the process chamber 201. In this case, $N_2$ gas is continuously supplied into the process chamber 201 while the valves 514, 524 and 534 are open. The $N_2$ gas acts as a purge gas to increase the effect of eliminating the $TiCl_4$ gas (that did not react or that contributed to the formation of the Ti-containing layer that contains Cl) remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, a subsequent step to be performed thereafter will not be badly influenced by the gas. In this case, the flow rate of the $N_2$ gas to be supplied into the process chamber 201 does not need to be high. For example, the inside of the process chamber 201 may be purged without causing the subsequent step to be badly influenced by the gas by supplying an amount of a gas corresponding to the capacity of the reaction tube 203 (the process chamber 201). As described above, since the inside of the process chamber 201 is not completely purged, a purge time may be reduced to improve the throughput. Furthermore, the consumption of the $N_2$ gas may be suppressed to a necessary minimum level.

<Step 23>
($NH_3$ Gas Supply Process)

After the residual gas is removed from the inside of the process chamber 201, the valve 334 of the gas supply pipe 330 is opened to supply $NH_3$ gas into the gas supply pipe 330. The flow rate of the $NH_3$ gas flowing in the gas supply pipe 330 is adjusted by the MFC 332. The flow rate-adjusted $NH_3$ gas is supplied into the process chamber 201 via the gas supply holes 430a of the nozzle 430. The $NH_3$ gas supplied into the process chamber 201 is activated by heat, and exhausted via the exhaust pipe 231. In this case, the thermally activated $NH_3$ gas is supplied onto the wafer 200. That is, a surface of the wafer 200 is exposed to the thermally activated $NH_3$ gas. At the same time, the valve 534 is opened to supply $N_2$ gas into the carrier gas supply pipe 530. The flow rate of the $N_2$ gas flowing in the carrier gas supply pipe 530 is adjusted by the MFC 532. The $N_2$ gas is supplied into the process chamber 201, together with the $NH_3$ gas, and exhausted via the exhaust pipe 231. In this case, the valves 514 and 524 are opened to supply $N_2$ gas into the carrier gas supply pipes 510 and 520 so as to prevent the $NH_3$ gas from flowing into the nozzles 410 and 420. The $N_2$ gas is supplied into the process chamber 201 via the gas supply pipes 310 and 320 and the nozzles 410 and 420, and exhausted via the exhaust pipe 231.

When the $NH_3$ gas is activated by heat and supplied, the APC valve 243 is appropriately controlled such that the pressure in the process chamber 201 is in, for example, a range of 1 Pa to 10,000 Pa. The supply flow rate of the $NH_3$ gas controlled by the MFC 332 is set to be within, for example, a range of 10 sccm to 50,000 sccm. The supply flow rates of the $N_2$ gas controlled by the MFCs 512, 522 and 532 are set to be in, for example, a range of 10 sccm to 10,000 sccm. A duration for which the $NH_3$ gas activated by heat is supplied onto the wafer 200, i.e., a gas supply time (irradiation time), is set to range, for example, from 0.1 to 120 seconds. In this case, the temperature of the heater 207 is set such that the temperature of the wafer 200 is within, for example, a range of 200° C. to 500° C., similar to Step 21.

In this case, the thermally activated $NH_3$ gas is supplied into the process chamber 201 by increasing pressure in the process chamber 201. The activated $NH_3$ gas reacts with at least a portion of the Ti-containing layer formed on the wafer 200 in Step 21. Accordingly, the Ti-containing layer is nitrided to be modified into a titanium nitride layer (a TiN layer).

<Step 24>
(Residual Gas Removing Process)

After the TiN layer is formed, the valve 334 of the gas supply pipe 330 is closed to stop the supply of the $NH_3$ gas. In this case, the inside of the process chamber 201 is vacuum-exhausted by the vacuum pump 246 in a state in which the APC valve 243 of the exhaust pipe 231 is open, thereby eliminating the $NH_3$ gas (that did react or that contributed to the formation of the TiN layer) or byproducts remaining in the process chamber 201 from the process chamber 201. In this case, $N_2$ gas is continuously supplied into the process chamber 201 while the valves 514, 524 and 534 are open. The $N_2$ gas acts as a purge gas to increase the effect of eliminating the $NH_3$ gas (that did not react or that contributed to the formation of the TiN layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, a subsequent step to be performed thereafter will not be badly influenced by the gas. In this case, the flow rate of the $N_2$ gas to be supplied into the process chamber 201 does not need to be high. For example, the inside of the process chamber 201 may be purged without causing the subsequent step to be badly influenced by the gas by supplying an amount of a gas corresponding to the capacity of the reaction tube 203 (the process chamber 201). As described above, since the inside of the process chamber 201 is not completely purged, a purge time may be reduced to improve the throughput. Furthermore, the consumption of the $N_2$ gas may be suppressed to a necessary minimum level.

Steps 21 to 24 described above are performed only predetermined X times (M times). That is, one set including Steps 21 to 24 is performed only X times. As described above, the supplying of the $TiCl_4$ gas and the supplying of the $NH_3$ gas are alternately performed X times to form a TiN layer (first layer) to a predetermined thickness, for example, a thickness of 0.03 nm to 20 nm.

After Steps 21 to 24 described above are performed X times (X sets), a process of forming an AlCTiN layer (Steps 25 to 30) which will be described below is performed.

<Step 25>
(TMA Gas Supply Process)

The valve 324 of the gas supply pipe 320 is opened to supply TMA [trimethylaluminum $(CH_3)_3Al$] gas into the gas supply pipe 320. The flow rate of the TMA gas flowing in the gas supply pipe 320 is adjusted by the MFC 322. The flow rate-adjusted TMA gas is supplied into the process chamber 201 via the gas supply holes 420a of the nozzle 420, and exhausted via the exhaust pipe 231. In this case, the TMA gas is supplied onto the wafer 200. That is, a surface of the wafer 200 is exposed to the TMA gas. At the same time, the valve 524 is opened to supply $N_2$ gas into the carrier gas supply pipe 520. The flow rate of the $N_2$ gas flowing in the carrier gas supply pipe 520 is adjusted by the MFC 522. The flow rate-adjusted $N_2$ gas is supplied into the process chamber 201 together with the TMA gas, and exhausted via the exhaust pipe 231. In this case, the valves 514 and 534 are opened to supply $N_2$ gas into the carrier gas supply pipes 510 and 530 so as to prevent the TMA gas from flowing into the nozzles 410 and 430. The $N_2$ gas is supplied into the process chamber 201 via the gas supply pipe 310, the gas supply pipe 330 and the nozzles 410 and 430, and exhausted via the exhaust pipe 231.

In this case, the APC valve 243 is appropriately adjusted to set the pressure in the process chamber 201 to be within, for example, a range of 1 to 10,000 Pa, similar to Step 21. The supply flow rate of the TMA gas controlled by the MFC 332 is set to be within, for example, a range of 10 to 10,000 sccm. The supply flow rates of the $N_2$ gas controlled by the MFCs 512, 522 and 532 are set to be within, for example, a range of 100 to 10,000 sccm. A duration for which the TMA gas is supplied onto the wafer 200, i.e., a gas supply time (irradiation time), is set to be within, for example, a range of 0.1 to 120 seconds. In this case, the temperature of the heater 207 is set such that the temperature of the wafer 200 is within, for example, a range of 200 to 500° C., similar to Step 21. When the TMA gas is supplied, a layer that contains carbon (C) and aluminum (Al) is formed on the TiN layer. The layer that contains carbon (C) and aluminum (Al) has a thickness, for example, of less than one atomic layer to several atomic layers.

<Step 26>
(Residual Gas Removing Process)

Thereafter, the valve 324 of the gas supply pipe 320 is closed to stop the supply of the TMA gas. In this case, the inside of the process chamber 201 is vacuum-exhausted by the vacuum pump 246 in a state in which the APC valve 243 of the exhaust pipe 231 is open, thereby eliminating the TMA gas (that did react or that contributed to the formation of the layer that contains C and Al) remaining in the process chamber 201 from the process chamber 201. In this case, $N_2$ gas is continuously supplied into the process chamber 201 while the valves 510, 520 and 530 are open. The $N_2$ gas acts as a purge gas to increase the effect of eliminating the TMA gas (that did not react or that contributed to the formation of the Ti-containing layer that contains C and Al) remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, a subsequent step to be performed thereafter will not be badly influenced by the gas. In this case, the flow rate of the $N_2$ gas to be supplied into the process chamber 201 does not need to be high. For example, the inside of the process chamber 201 may be purged without causing the subsequent step to be badly influenced by the gas by supplying an amount of a gas corresponding to the capacity of the reaction tube 203 (the process chamber 201). As described above, since the inside of the process chamber 201 is not completely purged, a purge time may be reduced to improve the throughput. Furthermore, the consumption of the $N_2$ gas may be suppressed to a necessary minimum level.

<Step 27>
($TiCl_4$ Gas Supply Process)

Next, $TiCl_4$ gas is supplied into the process chamber 201, similar to Step 21. In this case, the APC valve 243 is appropriately adjusted to set the pressure in the process chamber 201 to be within, for example, a range of 1 to 10,000 Pa. The supply flow rate of the $TiCl_4$ gas controlled by the MFC 312 is set to be within, for example, a range of 10 to 10,000 sccm. The supply flow rates of the $N_2$ gas controlled by the MFCs 512, 522 and 532 are set to be within, for example, a range of 10 to 10,000 sccm. A duration for which the $TiCl_4$ gas is supplied onto the wafer 200, i.e., a gas supply time (irradiation time), is set to be within, for example, a range of 0.1 to 120 seconds. In this case, the temperature of the heater 207 is set such that the temperature of the wafer 200 is within, for example, a range of 200 to 500° C. The $TiCl_4$ gas supplied into the process chamber 201 reacts with at least a part of the layer that contains C and Al. Thus, the layer that contains C and Al is modified into a layer that contains carbon (C), aluminum (Al) and titanium (Ti).

<Step 28>
(Residual Gas Process)

Thereafter, the $TiCl_4$ gas (that did not react or that contributed to the formation of the layer that contains carbon (C), aluminum (Al) and titanium (Ti)) or byproducts remaining in the process chamber 201 are eliminated from the inside of the process chamber 201, similar to Step 22.

<Step 29>
($NH_3$ Gas Supply Process)

Next, $NH_3$ gas is supplied into the process chamber 201, similar to Step 23. In this case, the APC valve 243 is appropriately adjusted to set the pressure in the process chamber 201 to be within, for example, a range of 1 to 10,000 Pa. The supply flow rate of the $NH_3$ gas controlled by the MFC 322 is set to be within, for example, a range of 10 to 50,000 sccm. The supply flow rates of the $N_2$ gas controlled by the MFCs 512, 522 and 532 are set to be within, for example, a range of 10 to 10,000 sccm. A duration for which the $NH_3$ gas activated by heat is supplied onto the wafer 200, i.e., a gas supply time (irradiation time), is set to be within, for example, a range of 0.1 to 120 seconds. In this case, the temperature of the heater 207 is set such that the temperature of the wafer 200 is within, for example, a range of 200 to 500° C., similar to Step 21. The $NH_3$ gas supplied into the process chamber 201 reacts with at least a part of the layer that contains C, Al and Ti. Thus, the layer that contains C, Al and Ti is modified into the AlCTiN-containing layer described above.

<Step 30>
(Residual Gas Removing Process)

Thereafter, the $TiCl_4$ gas (that did not react or that contributed to the formation of the AlCTiN-containing layer) or byproducts remaining in the process chamber 201 are eliminated from the inside of the process chamber 201, similar to Step 24.

Steps 25 to 30 described above are performed only predetermined Y times (N times). That is, one set including Steps 25 to 30 is performed only Y times. As described above, the supplying of the TMA gas, the supplying of the $TiCl_4$ gas and the supplying of the $NH_3$ gas are alternately performed Y times to form an AlCTiN layer (second layer) to a predetermined thickness, for example, a thickness of 0.1 nm to 20 nm.

The TiAlCN film as a gate electrode has a stack structure including the TiN layer and the AlCTiN layer described above. The forming of the TiN layer and the forming of the AlCTiN layer are alternately and repeatedly performed Z times (L times) to form the TiAlCN film to a predetermined thickness (e.g., a thickness of 1.0 to 20 nm). The TiAlCN film may be also referred to as an AlC-doped TiN film (AlC-added TiN film) obtained by doping Al and C onto the TiN film.

Here, a ratio of each of the elements of TiAlCN film may be adjusted, based on the number of times Steps 21 to 24 of forming the TiN layer are performed ('X' or the product of 'X' and 'Z' described above) and the number of times Steps 25 to 30 of forming the AlCTiN layer are performed ('Y' or the product of 'Y' and 'Z' described above). That is, by adjusting the number of times each of the steps described above are performed, a work function of a gate electrode formed of the TiAlCN film may be tuned (adjusted or modulated). In other words, 'X', 'Y', and 'Z' are determined based on the ratio of nitrogen or carbon (or the ratios of nitrogen, carbon, titanium and aluminum) contained in the TiAlCN film. Also, 'X' and 'Y' each denote an integer that is equal to or greater than '0', and 'Z' denotes an integer that is equal to or greater than '1.' 'X' and/or 'Y' are preferably set to be each an integer that is equal to or greater than '1.'

Both the work functions of two elements (Ti and Al) among the elements contained in the TiAlCN film are about 4.3 eV. The inventors of the present application have found that a work function of a TiAlCN film may be increased or decreased by adjusting the ratio of C or N, based on the work functions of Ti and Al, i.e., about 4.3 eV. In detail, the work function is lower than 4.3 eV when the ratio of C is increased, and is higher than 4.3 eV when the ratio of N is increased. Thus, a metal film having a desired work function may be formed by determining 'X', 'Y' and 'Z' based on the ratio of N or C contained in the TiAlCN film.

(Purging and Atmospheric Pressure Recovery)

After the TiAlCN film is formed to the predetermined thickness, an inert gas such as $N_2$ is supplied into the process chamber 201 and exhausted via the exhaust pipe 231 to purge the inside of the process chamber 201 with the inert gas (gas purging). Thereafter, an atmosphere in the process chamber 201 is replaced with the inert gas (inert gas replacement), and the pressure in the process chamber 201 is restored to normal pressure (atmospheric pressure recovery).

(Boat Unloading and Wafer Discharging)

Then, the seal cap 219 is moved downward by the boat elevator 115 to open the lower end of the reaction tube 203, and the processed wafers 200 are unloaded to the outside of the reaction tube 203 from the lower end of the reaction tube 203 while being supported by the boat 217 (boat unloading). Thereafter, the processed wafers 200 are unloaded from the boat 217 (wafer discharging).

Fifth Embodiment

Next, a fifth embodiment of the present invention will be described below. The TiN layer, i.e., a metal nitride film, is formed as the first layer of the TiAlCN film in the fourth embodiment, whereas a metal carbide film is formed instead of a metal nitride film in the fifth embodiment.

For example, a TiAlCN film that includes a metal carbide film as a first layer may be formed in the following sequence. The sequence includes a process of forming a metal film (e.g., a TiAlCN) which includes nitrogen (N) and carbon (C) in a predetermined ratio on the wafer 200 by alternately performing L times the formation of a first layer (e.g., a TiC layer) containing a metal element (e.g., Ti) and carbon (C) on the wafer 200 M times and the formation of a second layer (e.g., AlCTiN) containing the metal element (e.g., Ti), nitrogen (N) and carbon (C) on the wafer 200 N times.

Also, an exemplary sequence according to the present embodiment includes a process of forming a metal film (e.g., a TiAlCN film) containing nitrogen (N) and carbon (C) in a predetermined ratio on the wafer 200 by alternately performing L times the alternately supplying of a first source (e.g., $TiCl_4$) containing a metal element (e.g., Ti) and a second source (e.g., $Hf[C_5H_4(CH_3)]_2(CH_3)_2$) containing carbon (C) onto the wafer 200 M times; and the alternately supplying of a third source (e.g., TMA) containing carbon (C), a fourth source (e.g., $TiCl_4$) containing the metal element (e.g., Ti) and a fifth source (e.g., $NH_3$) containing nitrogen (N) onto the wafer 200 N times. Also, in this sequence, a gas supply system configured to supply $Hf[C_5H_4(CH_3)]_2(CH_3)_2$ into the process chamber 201 is further included in the substrate processing apparatus 10.

Although cases in which a TiAlCN film is formed as a metal film of a gate electrode have been described in the fourth and fifth embodiments described above, the metal film is not limited thereto, and the present invention is applicable to forming a metal carbide film, a metal nitride film, or a metal carbonitride film containing at least one metal element selected from the group consisting of tantalum (Ta), cobalt (Co), tungsten (W), molybdenum (Mo), ruthenium (Ru), yttrium (Y), lanthanum (La), zirconium (Zr), and hafnium (Hf) or forming a silicide film containing the at least one metal element and silicon (Si). In this case, tantalum tetrachloride ($TaCl_4$), etc. may be used as a Ta-containing source. Co amd $[(tBu)NC(CH_3)N(tBu)_2Co]$, etc. may be used as a Co-containing source. Tungsten hexafluoride ($WF_6$), etc. may be used as a W-containing source. Molybdenum chloride ($MoCl_3$ or $MoCl_5$), etc. may be used as a Mo-containing source. 2,4-dimethylpentadienyl(ethylcyclopentadienyl)ruthenium $[Ru(EtCp)(C_7H_{11})]$, etc. may be used as a Ru-containing source. Tris(ethylcyclopentadienyl)yttrium $[Y(C_2H_5C_5H_4)_3]$, etc. may be used as a Y-containing source. Tris(isopropylcyclopentadienyl)lanthanum $[La(i-C_3H_7C_5H_4)_3]$, etc. may be used as a La-containing source. Tetrakis(ethylmethylamino)zirconium $[Zr(N[CH_3(C_2H_5)]_4)]$, etc. may be used as a Zr-containing source. Tetrakis(ethylmethylamino)hafnium $[Hf(N[CH_3(C_2H_5)]_4)]$, etc. may be used as an Hf-containing source. Tetrachlorosilane ($SiCl_4$), hexachlorosilane ($Si_2Cl_6$), dichlorosilane ($SiH_2Cl_2$), tris(dimethylamino)silane ($SiH[N(CH_3)_2]_3$), bis-tertiary-butyl aminosilane ($H_2Si[HNC(CH_3)_2]_2$, etc. may be used as a Si-containing source.

Although cases in which TMA gas or $Hf[C_5H_4(CH_3)]_2(CH_3)_2$ gas is used as a carbon-containing source have been described above in the fourth and fifth embodiments, the present invention is not limited thereto, and $Zr[C_5H_4(CH_3)]_2(CH_3)_2$ gas, ethylene ($C_2H_4$), propylene ($C_3H_6$), butene ($C_4H_8$), pentene ($C_5H_{10}$), hexene ($C_6H_{12}$), heptene ($C_7H_{14}$), octene ($C_8H_{16}$), ethane ($C_2H_6$), propane ($C_3H_8$), butane ($C_4H_{10}$), pentane ($C_5H_{12}$), hexane ($C_6H_{14}$), heptane ($C_7H_{16}$), octane ($C_8H_{18}$), etc. may be used as a carbon source.

Also, although cases in which the first layer includes one metal element have been described above in the fourth and fifth embodiments, the present invention is not limited thereto and the first layer may include two or more metal elements (e.g., Ti and Al). Also, although the same metal element is included in the first and second layers in the above fourth and fifth embodiments, the present invention is not limited thereto. For example, the first layer may include Ti and the second layer may not include Ti in the above embodiments.

When the ratio of C contained in the metal film is '0' in the above fourth and fifth embodiments, a TiAlN film or a TiN film may be formed instead of the TiAlCN film. Also, when the ratio of N contained in the metal film is '0', a TiAlC film or a TiC film may be formed instead of the TiAlCN film.

Also, although a TiN layer and an AlCTiN layer are sequentially formed to form a TiAlCN film in the above fourth and fifth embodiments, the AlCTiN layer and the TiN layer may be sequentially formed. Similarly, the AlCTiN layer and the TiC layer may be sequentially formed instead of in the order of the TiC layer and the AlCTiN layer.

The above embodiments, modified examples, and application examples may be used in appropriate combination.

Also, the present invention is not limited to the above embodiments and may be embodied in many different forms without departing from the scope of the invention.

In the previous embodiments, cases in which a film is formed using a batch-type vertical substrate processing apparatus capable of processing a plurality of substrates at one time have been described above. However, the present invention is not limited thereto and is preferably applicable to a case in which a film is formed using a single-substrate processing apparatus capable of processing one or several substrates at one time. Also, although cases in which a film is formed using a substrate processing apparatus including a hot wall type process furnace have been described in the previous embodiments, the present invention is not limited thereto and is preferably applicable to cases in which a film is formed using a substrate processing apparatus including a cold wall type process furnace Also, although cases in which $TiCl_4$ gas is used as a metal source gas which is a Ti-containing source have been described in the previous embodiments, the present invention is not limited thereto, and not only a halide such as tetrakis(dimethylamino)titanium (TDMAT, $Ti[N(CH_3)_2]_4$), tetrakis(diethylamino) titanium (TDEAT, $Ti[N(CH_2CH_3)_2]_4$), etc. but also an organic compound or a titanium (Ti)-containing gas which is an amino-based compound may be used.

Also, in the previous embodiments, cases in which $NH_3$ gas is used as a nitriding gas have been described, the present invention is not limited thereto, and diazene ($N_2H_2$) gas, hydrazine ($N_2H_4$) gas, $N_3H_8$ gas, nitrogen ($N_2$), nitrous oxide ($N_2O$), monomethyl hydrazine ($CH_6N_2$), dimethyl hydrazine ($C_2H_8N_2$), etc. may be used.

As an inert gas, not only $N_2$ gas but also a rare gas, such as Ar gas, He gas, Ne gas, Xe gas, etc., may be used.

Also, the present invention may be accomplished, for example, by changing a process recipe installed in an existing substrate processing apparatus. In order to change the installed process recipe, a process recipe according to the present invention may be installed in the existing substrate processing apparatus via an electrical communication line or a recording medium storing the process recipe according to the present invention. Otherwise, the process recipe installed in the existing substrate processing apparatus may be directly changed to the process recipe according to the present invention by manipulating an I/O device of the existing substrate processing apparatus.

Various examples of the present invention will be described below but the present invention is not limited thereto.

EXAMPLE 1

A TiCN film was formed on the wafer 200 according to the sequence according to the above first embodiment, and an experiment was conducted to perform an X-ray photoelectron spectroscopy (XPS) analysis thereon. In Example 1, a TiCN film was formed according to the film-forming flow of FIG. 4 and the gas supply timing of FIG. 5 by using $TiCl_4$ gas which is a Ti-containing gas as a first process gas, $Hf[C_5H_4(CH_3)]_2(CH_3)_2$ gas which is a C-containing gas as a second process gas, and $NH_3$ gas which is an N-containing gas as a third process gas. That is, the wafer 200 was loaded in the process chamber 201 (wafer loading), the wafer 200 was heated in an $N_2$ atmosphere (preheating), a TiC layer (a metal carbide layer) was formed by alternately and repeatedly supplying $TiCl_4$ gas and $Hf[C_5H_4(CH_3)]_2(CH_3)_2$ gas, $NH_3$ was alternately and repeatedly supplied onto the TiC layer (nitriding), a TiCN film was formed, residual gases are exhausted from the process chamber 201 (gas exhausting), the wafer 200 on which the TiCN film was formed was unloaded from the process chamber 201 (wafer unloading), and the XPS analysis was conducted. In this case, process conditions in each of the steps were set as follows.

(Step 11)
Temperature in process chamber: 400° C.;
Pressure in process chamber: 50 Pa (0.38 Torr);
Supply flow rate of $TiCl_4$ gas: 10 sccm to 50 sccm; and
Duration for which $TiCl_4$ gas was irradiated: 2 seconds
(Step 13)
Temperature in process chamber: 400° C.;
Pressure in process chamber: 50 Pa (0.38 Torr);
Supply flow rate of $Hf[C_5H_4(CH_3)]_2(CH_3)_2$ gas: 10 sccm to 50 sccm; and
Duration for which $Hf[C_5H_4(CH_3)]_2(CH_3)_2$ gas was irradiated: 50 seconds
(Step 15)
Temperature in process chamber: 400° C.;
Pressure in process chamber: 50 Pa (0.38 Torr);
Supply flow rate of $NH_3$ gas: 1,000 sccm; and
Duration for which $NH_3$ gas was irradiated: 20 seconds In this case, when Steps 15 and 16 were performed once, a number of times one set including Steps 11 to 14 was performed, i.e., a number of sets a TiC layer was formed, was set to be one (m=1). The TiCN film was formed to a thickness of 5 nm, and a 5 nm TiN film was formed as a cap layer on the TiCN film in-situ.

EXAMPLE 2

According to Example 2, a TiCN film was formed by setting a number of times one set including Steps 11 to 14 was performed, i.e., a number of sets a TiC layer formed, to three sets (m=3), when Steps 15 and 16 were performed once. The other process conditions were set to be the same as those of Example 1.

EXAMPLE 3

According to Example 3, a TiCN film was formed by setting a number of times one set including Steps 11 to 14 was performed, i.e., a number of sets a TiC layer was formed, to five sets (m=5) when Steps 15 and 16 were performed once. The other process conditions were set to be the same as those of Example 1.

Table 1 shows the process conditions and the concentrations of C in the TiCN films according to Examples 1 to 3. The concentration of C in the TiCN film was 17% to 18% in Example 1, was 25% to 30% in Example 2, and was 25% to 30% in Example 3.

TABLE 1

|  | Metal gate electrode | Gapping layer | Number of sets m | C concentration |
|---|---|---|---|---|
| Example 1 | TiCN (5 μm) | TiN (5 μm) | 1 set | 17%–18% |
| Example 2 |  |  | 3 sets | 25%–30% |
| Example 3 |  |  | 5 sets | 25%–30% |

Next, the experimental results according to Examples 1 to 3 will be described below.

Figure 12:
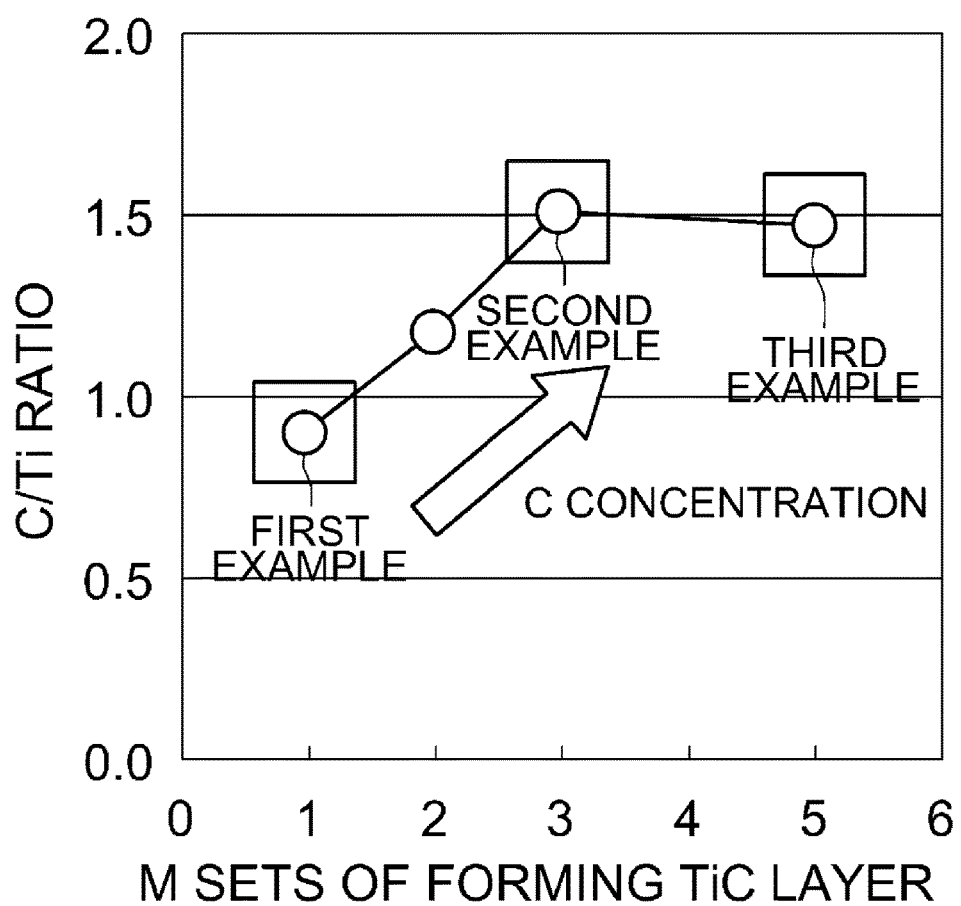
FIG. 12 is a graph illustrating a ratio of C/Ti measured by conducting an X-ray photoelectron spectroscopy (XPS) analysis on TiCN films according to Examples 1 to 3.

FIG. 12 is a graph illustrating a ratio of C/Ti which is the ratio between the concentrations of C and Ti, measured by conducting the XPS analysis on the TiCN films according to Examples 1 to 3. In FIG. 12, the horizontal axis denotes a number of steps m Step 11 to 14 are performed, and the vertical axis denotes a ratio of C/Ti, measured through the XPS analysis. Here, the ratio of C/Ti may be understood to mean the concentration of carbon (C) in the TiCN film. It is noted from the measurement result that the concentration of C increased at least until m=3. That is, the concentrations of carbon (C) in the TiCN films may be controlled by controlling a number of sets Steps 11 to 14 are performed. Also, the concentration of C when m=5 was substantially the same as when m=3, and saturated.

Figure 13A:
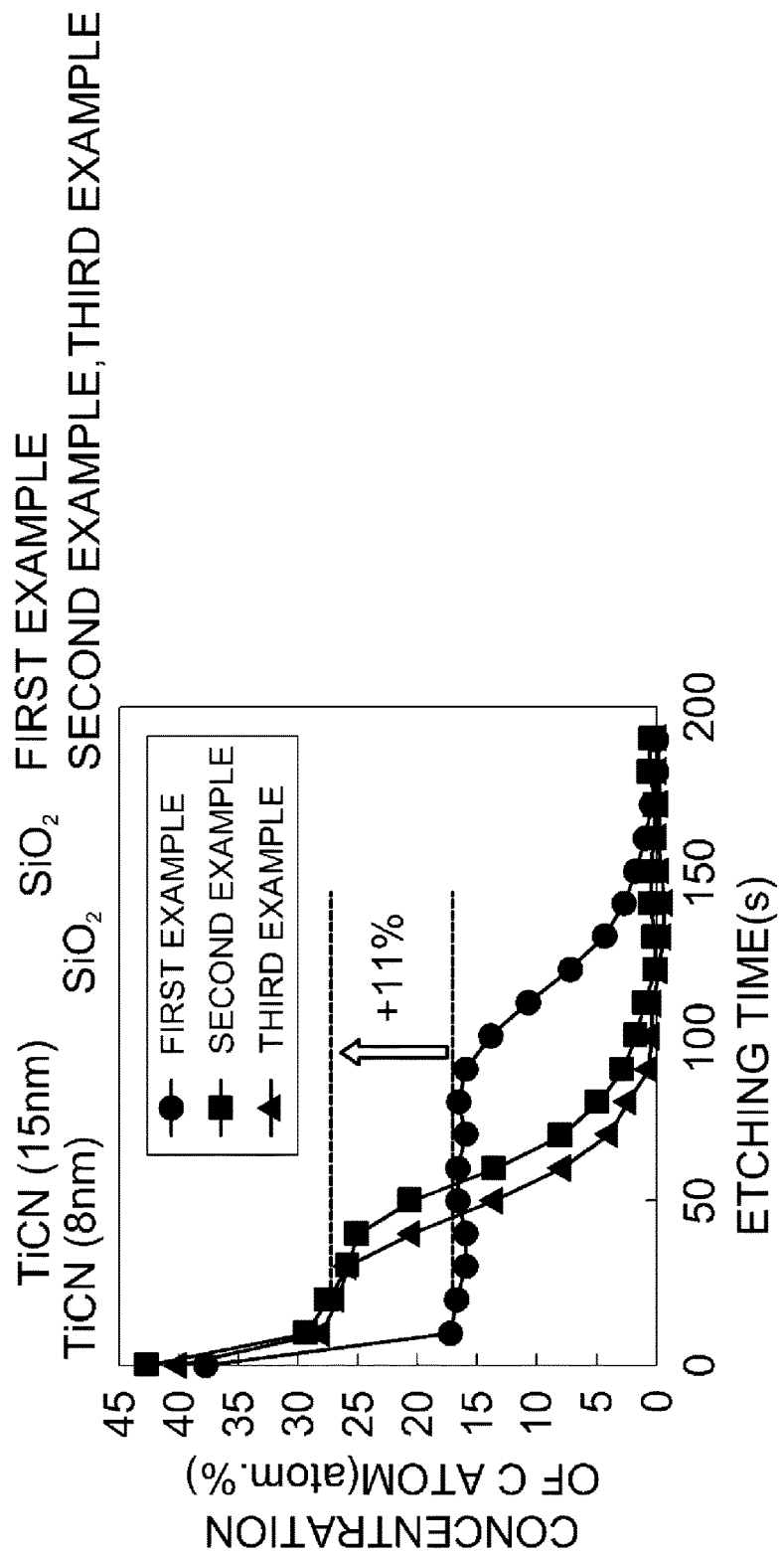
FIG. 13A is a graph illustrating the concentration of carbon (C) in the TiCN films according to Examples 1 to 3, measured by XPS.
Figure 13B:
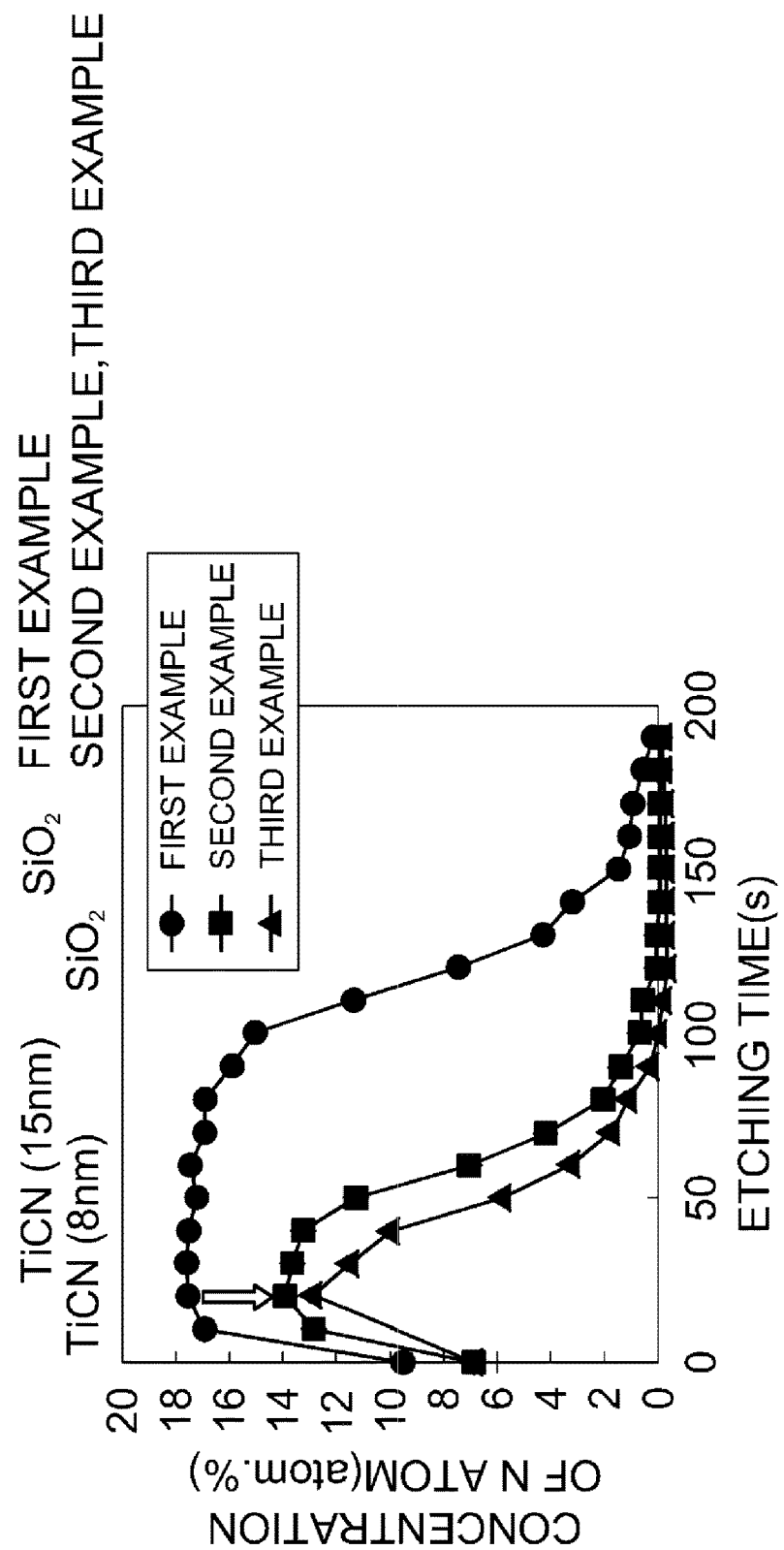
FIG. 13B is a graph illustrating the concentration of nitrogen (N) in the TiCN films according to Examples 1 to 3, measured by XPS.

FIG. 13A is a graph illustrating the concentration of carbon (C) in the TiCN films according to Examples 1 to 3, measured by XPS. FIG. 13B is a graph illustrating the concentration of nitrogen (N) in the TiCN films according to Examples 1 to 3, measured by XPS. In FIGS. 13A and 13B, the horizontal axes each denote an etch time, and the vertical axes denote the concentration of atoms of C (C at %) and the concentration of atoms of N (N at %), respectively. Tops of FIGS. 13A and 13B indicate the layers each etched at a corresponding etch time and illustrated along the horizontal axis.

In FIG. 13A, the result of analyzing the TiCN films revealed that the concentration of C increased by about 11% at the etch times in Examples 2 and 3, compared to Example 1. In FIG. 13B, the result of analyzing the TiCN films revealed that the concentration of N decreased by about 3.6% at the etch times in Examples 2 and 3, compared to Example 1. As described above, a comparison of FIGS. 13A and 13B reveals that there is a trade-off between the concentration of atoms of C and the concentration of atoms of N.

Figure 14A:
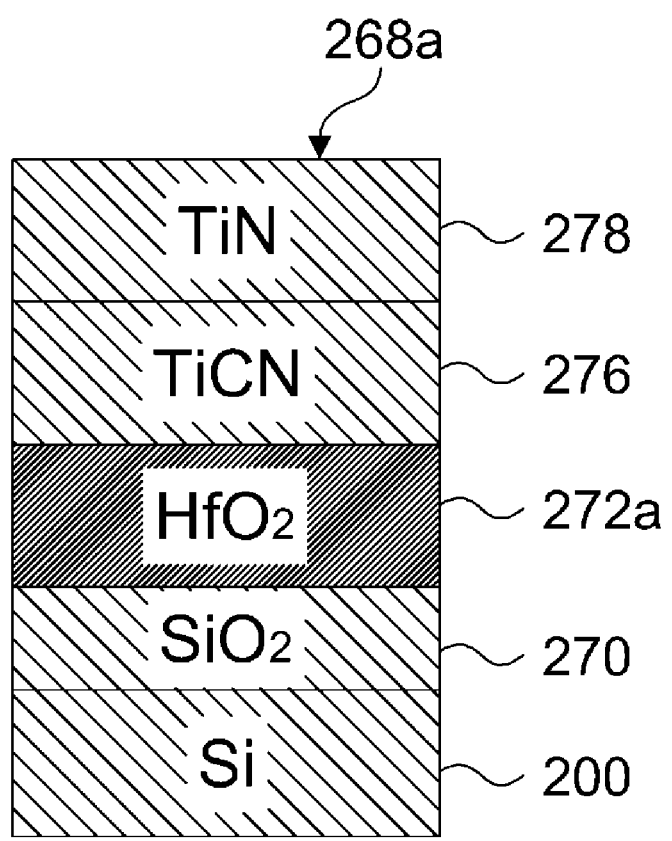
FIGS. 14A to 14C illustrate the structures of capacitors prepared for an experiment.
Figure 14B:
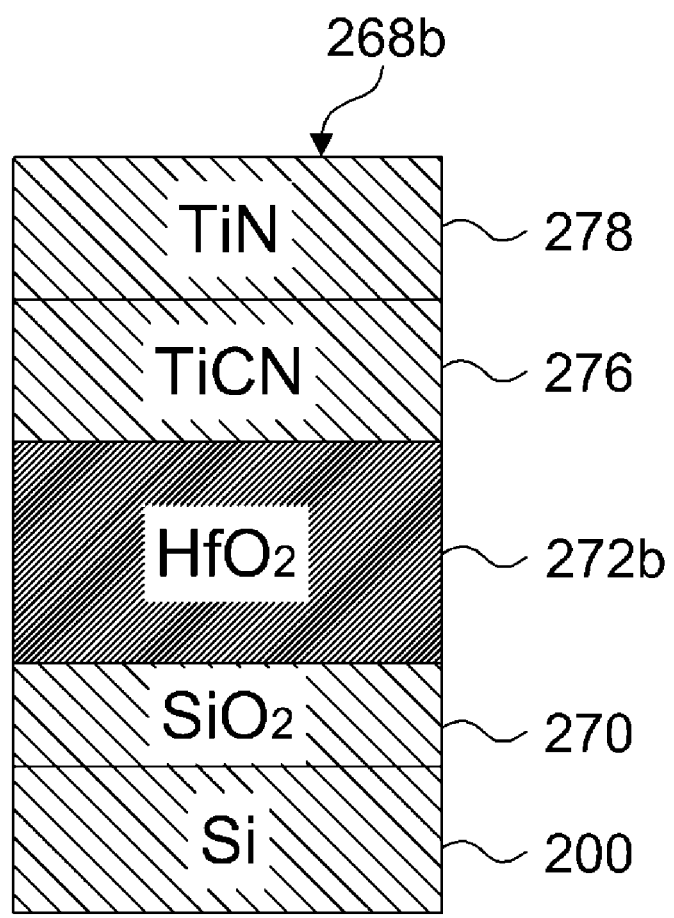
Figure 14C:
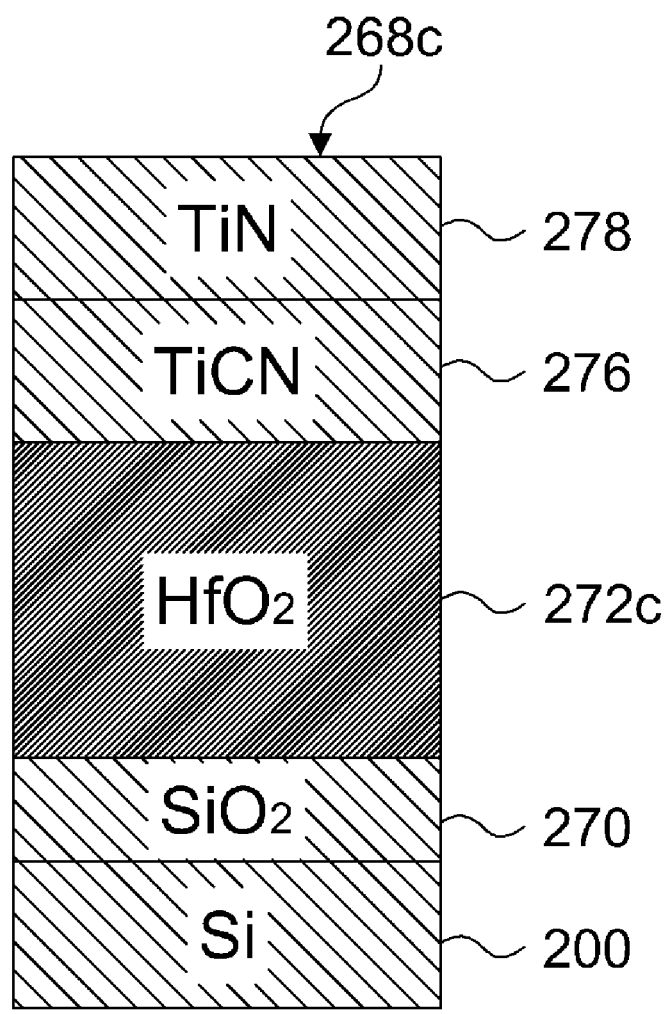

FIGS. 14A to 14C illustrate capacitors 268a to 268c prepared for an experiment, respectively. As illustrated in FIGS. 14A to 14C, the capacitors 268a to 268c were each formed by forming an SiO$_2$ film (silicon oxide film) 270 which is an insulating film on a surface of a silicon (Si)-wafer 200, forming one of HfO$_2$ films (hafnium oxide films) 272a to 272c which are insulating films on the SiO$_2$ film 270, forming a TiCN film 276 on one of the HfO$_2$ films 272a to 272c, and forming a TiN film (titanium nitride film) 278 on the TiCN film 276.

In detail, an HF treatment was performed on the silicon (Si)-wafer 200, the SiO$_2$ film 270 was formed, each of the HfO$_2$ films 272a to 272c was formed, the TiCN film 276 was formed, the TiN film 278 was formed, a cap TiN film was formed, a gate was patterned, the gate was etched, a resist was removed, and FGA was performed at 400° C.

The TiCN film 276 was formed according to the sequence of one of the previous embodiments. That is, the TiCN film 276 was formed according to the film-forming flow of FIG. 4 and the gas supply timing of FIG. 5 by using TiCl$_4$ gas as a Ti-containing gas, Hf[C$_5$H$_4$(CH$_3$)]$_2$(CH$_3$)$_2$ gas as a C-containing gas, and NH$_3$ gas as an N-containing gas. Here, in the capacitors 268a to 268c of FIGS. 14A to 14C, the TiCN film 276 was formed by setting a number of sets to three, i.e., m=3, as in Example 2, and the HfO$_2$ films which are insulating films 272a to 272c were formed to have different thicknesses.

Figure 15:
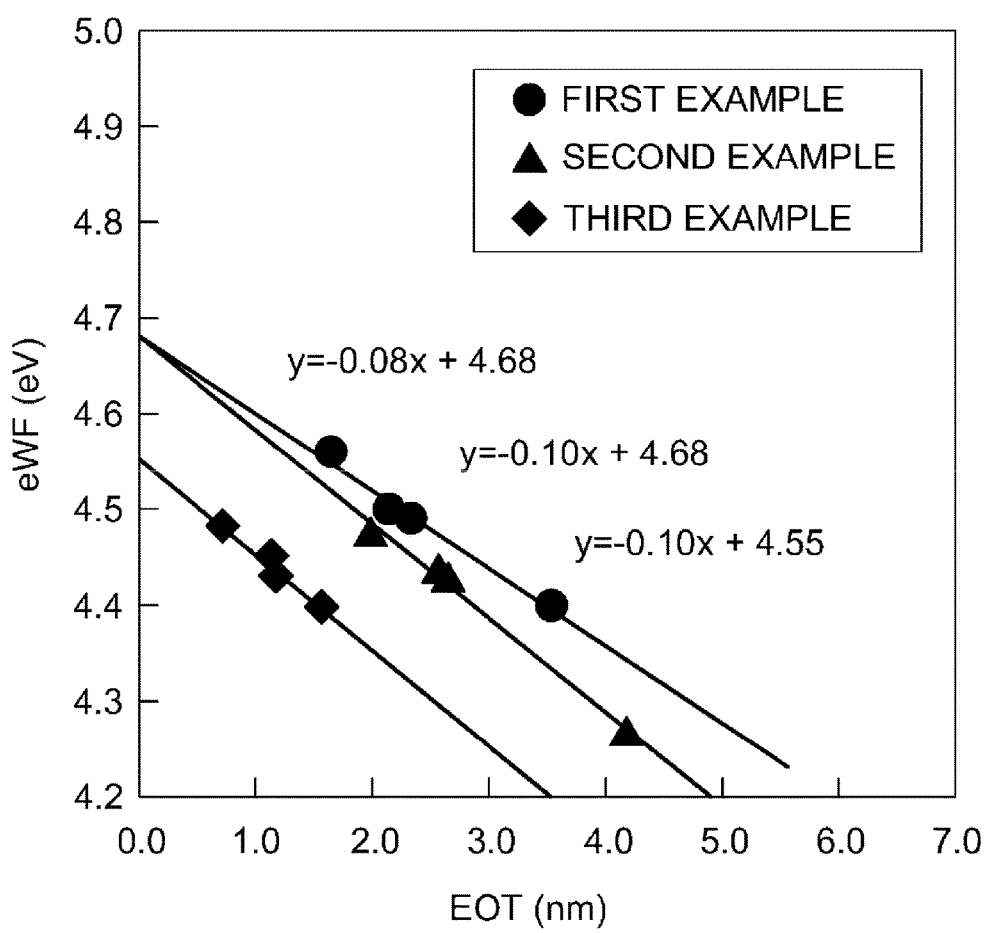
FIG. 15 is a graph in which data for calculating a work function is plotted.

A result of calculating work functions by plotting, on a graph, effective work functions (eWFs) of equivalent oxide thicknesses (EOTs) of the respective capacitors 268a to 268c is illustrated in FIG. 15.

FIG. 15 is a graph that plots EOTs and effective work functions (eWFs) of the TiCN films of the capacitors 268a to 268c. Oxygen contained in a high-k film such as an HfO$_2$ film is diffused and discharged from the high-k film when a heat treatment included in a process is performed, and thus an interface dipole is formed on an interface between the high-k film and an interface layer, thereby increasing an effective work function (eWF). A work function of a TiN film is about 5.0 eV, including a work function of the dipole, whereas a work function of the TiCN film 276 calculated from the graph of FIG. 15 is 4.55 eV to 4.68 eV as shown in Table 2 below. Also, the work function $\Phi_m = \Phi_{m,meas.} - e\Delta_{dipole} = 4.24$ eV to 4.37 eV when considering an effect $e\Delta_{dipole}$ of the dipole [0.31 eV, quoted from Y. Kamimura et al., IEDM 2007, PP. 341-344]. As described above, an experimental result revealed that a metal, the threshold voltage Vth of which is adjustable by controlling the concentration of C, i.e., a TiCN film as a metal film, the work function of which is tunable, was provided. Thus, according to the present invention, even when different work functions are required according to a purpose, it was confirmed that a work function can be adjusted using one film having a same element composition ratio.

TABLE 2

|           | $\Phi_{m, means}$(eV) | $\Phi_m$(eV) |
|-----------|------------------------|--------------|
| Example 1 | 4.68                   | 4.37         |
| Example 2 | 4.68                   | 4.37         |
| Example 3 | 4.55                   | 4.24         |

Next, examples according to the fourth embodiment will be described below but the present invention is not limited thereto. In each of the following examples, a TiAlCN film was formed on the wafer 200 (particularly, on an HfO film which is a high-k film) according to the above sequence according to FIGS. 10 and 11.

EXAMPLE 4

In Example 4, 'X', 'Y' and 'Z' described above were set to '6', '1' and '36', respectively. That is, in Example 4, the TiAlCN film was formed by alternately and repeatedly performing 36 times (Z=36) forming a TiN layer six times (X=6) and forming an AlCTiN layer once (Y=1).

In detail, in Example 4, the TiAlCN film was formed by alternately and repeatedly performing 36 times a process of forming a TiN layer by alternately supplying TiCl$_4$ gas and NH$_3$ gas six times and a process of forming an AlCTiN layer by supplying TMA gas, TiCl$_4$ gas and NH$_3$ gas once. In this case, process conditions in each of steps were set as follows.

<TiN Layer Forming Process>
(Step 21)
Temperature in process chamber: 350° C.;
Pressure in process chamber: 45 Pa;
Feed rate of TiCl$_4$ gas: 1.16 g/min; and
Duration for which TiCl$_4$ gas was irradiated: 5 seconds
(Step 23)
Temperature in process chamber: 350° C.;
Pressure in process chamber: 65 Pa;
Supply flow rate of NH$_3$ gas: 7,500 sccm; and
Duration for which NH$_3$ gas was irradiated: 15 seconds
<AlCTiN Layer Forming Process>
(Step 25)
Temperature in process chamber: 350° C.;
Pressure in process chamber: 65 Pa;
Feed rate of TMA gas: 0.6 g/min; and
Duration for which TMA gas was irradiated: 6 seconds
(Step 27)
Temperature in process chamber: 350° C.;
Pressure in process chamber: 45 Pa;

Feed rate of TiCl$_4$ gas: 1.16 g/min; and
Duration for which TiCl$_4$ gas was irradiated: 5 seconds
(Step 29)
Temperature in process chamber: 350° C.;
Pressure in process chamber: 65 Pa;
Supply flow rate of NH$_3$ gas: 7,500 sccm; and
Duration for which NH$_3$ gas was irradiated: 15 seconds
The formed TiAlCN film had a film thickness of 10 nm, and a 30 nm TiN film was formed as a cap layer on the TiAlCN film.

EXAMPLE 5

In Example 5, 'X', 'Y' and 'Z' described above were set to '3', '1' and '52', respectively. That is, in Example 5, the TiAlCN film was formed by alternately and repeatedly performing 52 times (Z=52) forming a TiN layer three times (X=3) and forming an AlCTiN layer once (Y=1).

In detail, in Example 5, the TiAlCN film was formed by alternately and repeatedly performing 52 times a process of forming a TiN layer by alternately supplying TiCl$_4$ gas and NH$_3$ gas three times and a process of forming an AlCTiN layer by supplying TMA gas, TiCl$_4$ gas and NH$_3$ gas once. In this case, process conditions in each of steps were set to be the same as those in Example 4. Also, the TiAlCN film formed in Example 5 had a film thickness of 10 nm.

EXAMPLE 6

In Example 6, 'X', 'Y' and 'Z' described above were set to '1', '1' and '78', respectively. That is, in Example 6, the TiAlCN film was formed by alternately and repeatedly performing 78 times (Z=78) forming a TiN layer once (X=1) and forming an AlCTiN layer once (Y=1).

In detail, in Example 6, the TiAlCN film was formed by alternately and repeatedly performing 78 times a process of forming a TiN layer by supplying TiCl$_4$ gas and NH$_3$ gas once and a process of forming an AlCTiN layer by supplying TMA gas, TiCl$_4$ gas and NH$_3$ gas once. In this case, process conditions in each of steps were set to be the same as those in Example 4. Also, the TiAlCN film formed in Example 6 had a film thickness of 10 nm.

EXAMPLE 7

In Example 7, 'X', 'Y' and 'Z' described above were set to '0', '1' and '100', respectively. That is, in Example 7, the TiAlCN film was formed by repeatedly performing 100 times (Z=100) forming an AlCTiN layer once (Y=1) without forming a TiN layer (X=0).

In detail, in Example 7, the TiAlCN film was formed by repeatedly performing 100 times a process of forming an AlCTiN layer by supplying TMA gas, TiCl$_4$ gas and NH$_3$ gas once. In this case, process conditions in each of steps were set to be the same as those in Example 4. Also, the TiAlCN film formed in Example 7 had a film thickness of 10 nm.

EXAMPLE 8

In Example 8, 'X', 'Y' and 'Z' described above were set to '1', '0' and '340', respectively. That is, in Example 8, the TiAlCN film was formed by repeatedly performing 340 times (Z=340) forming a TiN layer once (X=1) without forming an AlCTiN layer (Y=0).

In detail, in Example 8, the TiAlCN film was formed by repeatedly performing 340 times a process of forming a TiN layer by supplying TiCl$_4$ gas and NH$_3$ gas once. In this case, process conditions in each of steps were set to be the same as those in Example 4. Also, the TiAlCN film formed in Example 8 had a film thickness of 10 nm.

Figure 16:
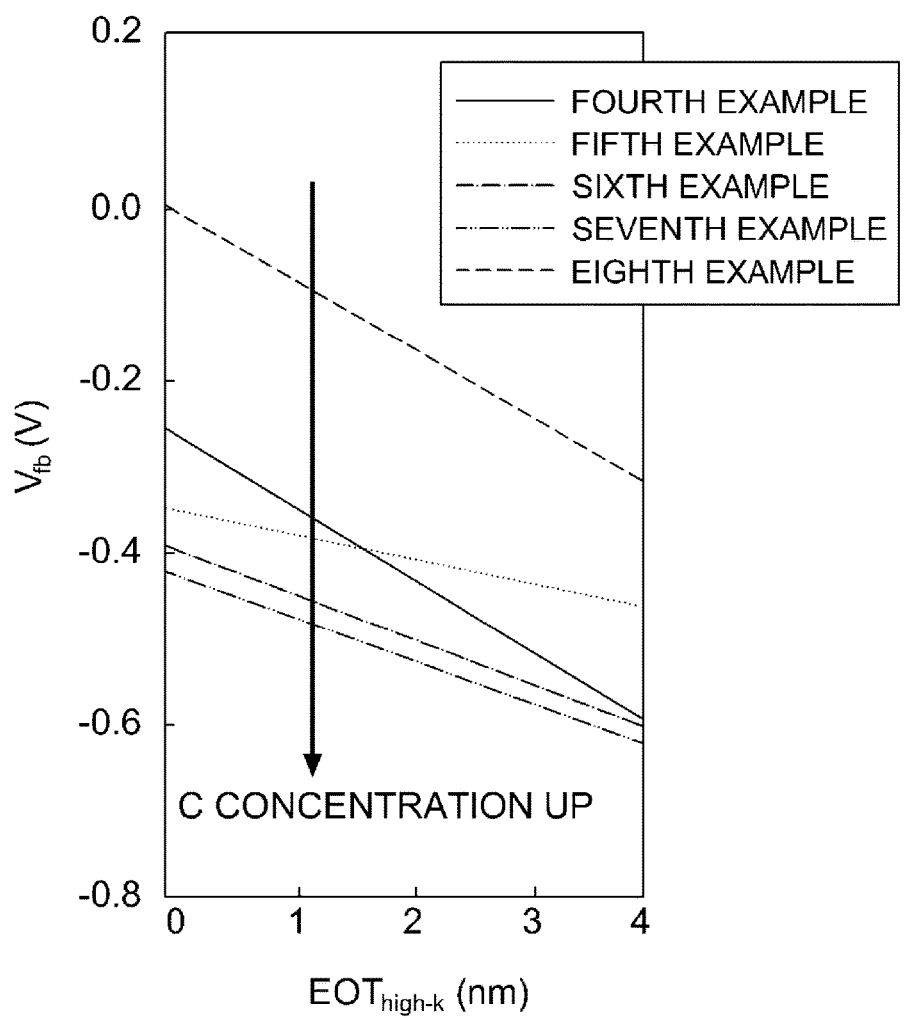
FIG. 16 is a graph illustrating the relationship between an equivalent oxide thickness and a flat-band voltage with respect to each of metal films formed according to Examples 4 to 8.

FIG. 16 is a graph illustrating the relationship between an EOT and a flat-band voltage Vfb of each of the metal films (the TiAlCN films or the TiN films) formed according to Examples 4 to 8. As illustrated in FIG. 16, the higher the ratio (concentration) of C (or the lower the ratio (concentration) of N), the more the flat-band voltage Vfb was shifted in a negative direction. When the flat-band voltage Vfb was shifted in the negative direction, a work function decreased.

Figure 18A:
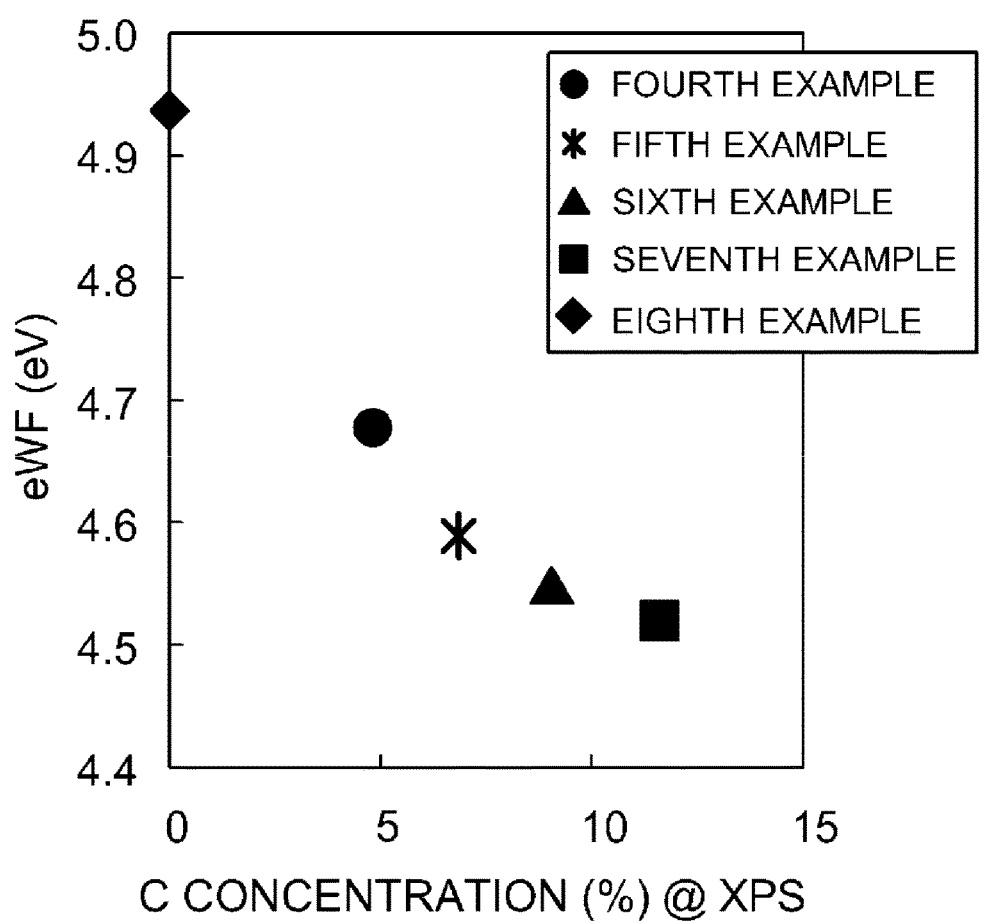
FIG. 18A is a graph illustrating a variation in a work function versus a ratio of carbon (C) in each of the metal films formed according to Examples 4 to 8.
Figure 18B:
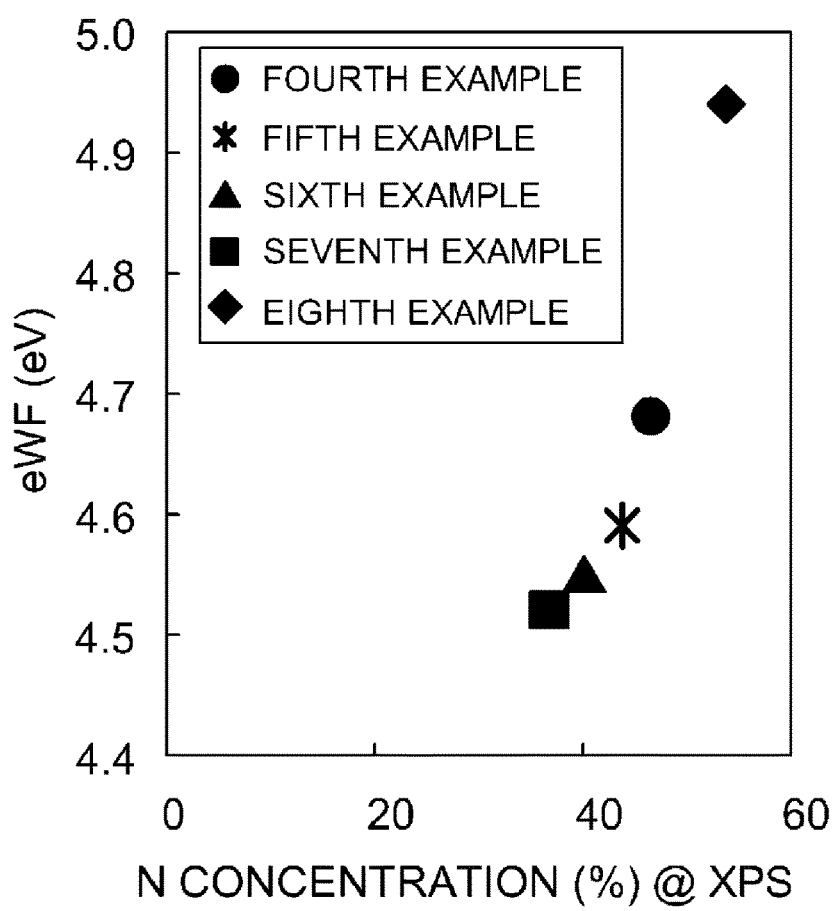
FIG. 18B is a graph illustrating a variation in a work function versus a ratio of nitrogen (N) in each of the metal films formed according to Examples 4 to 8.

FIG. 17 is a table illustrating the relationship between a ratio between carbon (C) and nitrogen (N) and an effective work function (eWF) of each of the metal films (the TiAlCN films or the TiN films) formed according to Examples 4 to 8. FIG. 18A is a graph illustrating a variation in a work function versus a ratio of carbon (C) in each of the metal films (the TiAlCN films or the TiN films) formed according to Examples 4 to 8. FIG. 18B is a graph illustrating a variation in a work function versus a ratio of nitrogen (N) in each of the metal films formed according to Examples 4 to 8. A work function of a metal film was tuned by adjusting 'X', 'Y' and 'Z' in the above examples, whereas FIGS. 17 to 18B illustrate effective work functions (eWFs) of gate electrodes each including one of the metal films formed according to the above examples. The effective work functions (eWFs) were calculated from the threshold voltage Vfb, including a value of a dipole formed at an interface between an HfO$_2$ film and an SiO$_2$ film.

As illustrated in FIGS. 17, 18A and 18B, an effective work function (eWF) decreased as the ratio of C contained in the TiAlCN film (or the TiN film) increased, and increased as the ratio of N contained in the TiAlCN film (or the TiN film) increased. The dipole was determined by the type of a high-k film and was set to have a constant value in the above examples. Thus, it may be concluded that a work function of the TiAlCN film decreases as the ratio of C in the TiAlCN film increases and increases as the ratio of N in the TiAlCN film increases.

Oxygen contained in a high-k film such as an HfO$_2$ film is diffused and discharged from the high-k film when a heat treatment included in a process is performed. Thus, an interface dipole is formed on an interface between the high-k film and an interface layer, thereby increasing an effective work function (eWF). As illustrated in FIG. 17, a work function of the TiN film which is a metal film according to Example 8 was about 5.0 eV, including a work function of the dipole, whereas work functions of the TiAlCN films which are metal films according to Examples 4 to 7 were 4.52 eV to 4.68 eV. Also, the work functions of the TiAlCN films were about 4.21 eV to 4.37 eV when considering an effect e$\Delta_{dipole}$ of the dipole [0.31 eV, quoted from Y. Kamimura et al., IEDM 2007, PP. 341-344]. It was confirmed that the work function is tunable by controlling the ratio of C and/or N contained in the TiAlCN films, based on the work functions of Ti and Al, i.e., about 4.3 eV.

The inventors of the present application found that the work functions of the TiAlN film and the TiN film which include Ti as a metal element and do not include C as a metal element were about 4.6 eV to 4.7 eV and the work function of the TiAlC film that includes Ti as a metal element and does not include N as a metal element was about 4.1 eV. That is, the work function of the TiAlCN film that includes Ti, C and N as metal elements may be tuned to a desired value between the work function of the TiAlC film and the work function of the TiAlN film (of the TiN film) by controlling the ratios of C and N of the TiAlCN film.

As described above, an experimental result revealed that a metal film, the threshold voltage Vth of which is adjustable by controlling the ratio of C and/or N, i.e., a TiAlCN film which is a metal film, the work function of which is tunable, was provided. Thus, according to the present invention, even when different work functions are required according to a purpose, it was confirmed that a work function can be adjusted using one film having a same element composition ratio.

Although an effective work function (eWF) can be tuned using φdipole or φFLP (fermi-level pinning), a work function of a metal film of a gate electrode is preferably tuned for the following reasons.

The value of φdipole is controlled according to a film type of a high-k film or by diffusing Al or La to the high-k film from a gate electrode. However, when the value of φdipole is controlled according to the film type of the high-k film, a dipole value is shifted in the same direction in the case of a NMOS transistor and a PMOS transistor (a dipole that is shifted in a negative direction is required in the NMOS transistor and a dipole that is shifted in a positive direction is required in the PMOS transistor). Thus, a high-k film for the NMOS transistor and a high-k film for the PMOS transistor should be formed separately, and thus, a process becomes complicated. Also, when the value of φdipole is controlled by diffusing Al or La to the high-k film from the gate electrode, a heat treatment should be performed at about 1,000° C. However, when the high-k film is used, the heat treatment performed at about 1,000° C. (which is generally a gate-last process) is performed before a gate stack (including an electrode, the high-k film, an $SiO_2$ film and a Si-substrate) is formed. Also, the heat treatment is performed to activate a source and drain. Thus, in the gate-last process, any heat treatment performed at about 1,000° C. is not preferably performed after the gate stack is formed. Although φdipole should be increased to increase a degree to which an effective work function (eWF) is tuned, mobility (a moving speed of electrons or holes) may decrease when φdipole increases. Also, although the value of φFLP can be controlled by adding silicon (Si) to an electrode, the electrode may have a high resistance value. Thus, the work function of a metal film is preferably tuned.

Hereinafter, exemplary embodiments according to the present invention are supplementarily noted.

According to the present invention, a work function may be adjusted while securing affinity with a process in terms of integration with a technique generally used in the art.

<Supplementary Note 1>

According to an aspect of the present invention, there is provided a method of manufacturing a semiconductor device, including: forming a film having a predetermined thickness and containing a first metal element, carbon and nitrogen on a substrate by: (a) forming a first layer containing the first metal element and carbon by supplying a metal-containing gas containing the first metal element and a carbon-containing gas to the substrate M times and (b) forming a second layer containing the first metal element, carbon and nitrogen by supplying a nitrogen-containing gas to the substrate having the first layer formed thereon N times to nitride the first layer, wherein M and N are selected in a manner that a work function of the film has a predetermined value (where M and N are natural numbers).

<Supplementary Note 2>

Preferably, the first metal element includes one selected from the group consisting of tantalum, cobalt, tungsten, molybdenum, ruthenium, yttrium, lanthanum, zirconium and hafnium.

<Supplementary Note 3>

Preferably, the metal-containing gas includes one selected from the group consisting of $TiCl_4$ and $TaCl_4$.

<Supplementary Note 4>

Preferably, the carbon-containing gas includes $Hf[C_5H_4(CH_3)]_2(CH_3)_2$.

<Supplementary Note 5>

Preferably, the carbon-containing gas includes a second metal element different from the first metal element.

<Supplementary Note 6>

Preferably, the second metal element includes hafnium.

<Supplementary Note 7>

Preferably, the work function of the film is increased by selecting M greater than N.

<Supplementary Note 8>

Preferably, a concentration of carbon in the film is controlled by selecting M and N to adjust the work function of the film to be the predetermined value.

<Supplementary Note 9>

According to another aspect of the present invention, there is provided a method of manufacturing a semiconductor device, including: forming a film having a predetermined thickness and containing a metal element, carbon and nitrogen on a substrate by: (a) supplying a metal-containing gas containing the metal element to the substrate M times; (b) supplying a carbon-containing gas to the substrate N times; and (c) supplying a nitrogen-containing gas to the substrate L times, wherein M, N and L are selected in a manner that a work function of the film has a predetermined value (where M, N and L are natural numbers).

<Supplementary Note 10>

According to another aspect of the present invention, there is provided a method of manufacturing a semiconductor device, including: forming a film having a predetermined thickness and containing a first metal element, a second metal element and carbon on a substrate by: (a) forming a first layer containing the first metal element by supplying a first metal-containing gas containing the first metal element to the substrate M times and (b) forming a second layer containing the first metal element, the second metal element and carbon by supplying a second metal-containing gas containing the second metal element and carbon to the substrate having the first layer formed thereon N times, wherein M and N are selected in a manner that a work function of the film has a predetermined value (where M and N are natural numbers).

<Supplementary Note 11>

Preferably, the first metal element includes one selected from the group consisting of titanium and tantalum, and the second metal element includes aluminium.

<Supplementary Note 12>

Preferably, the first metal-containing gas includes one selected from the group consisting of $TiCl_4$ and $TaCl_4$, and the second metal-containing gas includes trimethylaluminium (TMA).

<Supplementary Note 13>

According to still another aspect of the present invention, there is provided a substrate processing apparatus including: a process chamber configured to accommodate a substrate; a metal-containing gas supply system configured to supply a metal-containing gas containing a metal element to the substrate in the process chamber; a carbon-containing gas supply system configured to supply a carbon-containing gas to the substrate in the process chamber; a nitrogen-containing gas supply system configured to supply a nitrogen-containing gas to the substrate in the process chamber; and a control unit configured to control the metal-containing gas supply system, the carbon-containing gas supply system and the nitrogen-containing gas supply system to form a film having a predetermined thickness and containing the metal element, carbon and nitrogen on the substrate by: (a) forming a first layer containing the metal element and carbon by supplying the metal-containing gas and the carbon-containing gas to the substrate M times; and (b) forming a second layer containing the metal element, carbon and nitrogen by supplying the nitrogen-containing gas to the substrate having the first layer formed thereon N times to nitride the first layer, wherein M and N are selected in a manner that a work function of the film has a predetermined value (where M and N are natural numbers).

<Supplementary Note 14>

According to still another aspect of the present invention, there is provided a substrate processing apparatus including: a process chamber configured to accommodate a substrate; a first metal-containing gas supply system configured to supply a first metal-containing gas containing a first metal element to the substrate in the process chamber; a second metal-containing gas supply system configured to supply a second metal-containing gas containing a second metal element and carbon to the substrate in the process chamber; and a control unit configured to control the first metal-containing gas supply system and the second metal-containing gas supply system to form a film having a predetermined thickness and containing the first metal element, the second metal element and carbon on the substrate by: (a) forming a first layer containing the first metal element by supplying the first metal-containing gas to the substrate M times; and (b) forming a second layer containing the first metal element, the second metal element and carbon by supplying the second metal-containing gas to the substrate having the first layer formed thereon N times, wherein M and N are selected in a manner that a work function of the film has a predetermined value (where M and N are natural numbers).

<Supplementary Note 15>

According to still another aspect of the present invention, there is provided a program causing a computer to perform forming a film having a predetermined thickness and containing a metal element, carbon and nitrogen on a substrate in a process chamber of a substrate processing apparatus by: (a) forming a first layer containing the metal element and carbon by supplying a metal-containing gas containing the metal element and a carbon-containing gas to the substrate M times and (b) forming a second layer containing the first metal element, carbon and nitrogen by supplying a nitrogen-containing gas to the substrate having the first layer formed thereon N times to nitride the first layer, wherein M and N are selected in a manner that a work function of the film has a predetermined value (where M and N are natural numbers).

<Supplementary Note 16>

According to still another aspect of the present invention, there is provided a program causing a computer to perform: forming a film having a predetermined thickness and containing a first metal element, a second metal element and carbon on a substrate in a process chamber of a substrate processing apparatus by: (a) forming a first layer containing the first metal element by supplying a first metal-containing gas containing the first metal element to the substrate M times and (b) forming a second layer containing the first metal element, the second metal element and carbon by supplying a second metal-containing gas containing the second metal element and carbon to the substrate having the first layer formed thereon N times, wherein M and N are selected in a manner that a work function of the film has a predetermined value (where M and N are natural numbers).

<Supplementary Note 17>

According to another aspect of the present invention, there is provided a non-transitory computer-readable recording medium storing a program causing a computer to perform: forming a film having a predetermined thickness and containing a metal element, carbon and nitrogen on a substrate in a process chamber of a substrate processing apparatus by: (a) forming a first layer containing the metal element and carbon by supplying a metal-containing gas containing the metal element and a carbon-containing gas to the substrate M times and (b) forming a second layer containing the first metal element, carbon and nitrogen by supplying a nitrogen-containing gas to the substrate having the first layer formed thereon N times, wherein M and N are selected in a manner that a work function of the film has a predetermined value (where M and N are natural numbers).

<Supplementary Note 18>

According to another aspect of the present invention, there is provided a non-transitory computer-readable recording medium storing a program causing a computer to perform: forming a film having a predetermined thickness and containing a first metal element, a second metal element and carbon on a substrate in a process chamber of a substrate processing apparatus by: (a) forming a first layer containing the first metal element by supplying a first metal-containing gas containing the first metal element to the substrate M times and (b) forming a second layer containing the first metal element, the second metal element and carbon by supplying a second metal-containing gas containing the second metal element and carbon to the substrate having the first layer formed thereon N times, wherein M and N are selected in a manner that a work function of the film has a predetermined value (where M and N are natural numbers).

<Supplementary Note 19>

According to another aspect of the present invention, there is provided a method of manufacturing a semiconductor device, including: (a) exposing a substrate to a nitrogen-containing gas; and (b) exposing the substrate to a titanium-containing gas and a carbon-containing gas alternately, wherein (b) is performed at least twice after (a) is performed once, thereby increasing a carbon concentration in a titanium carbonitride film.

<Supplementary Note 20>

Preferably, the substrate is exposed to the titanium-containing gas prior to the carbon-containing gas when (b) is performed at least twice.

<Supplementary Note 21>

According to another aspect of the present invention, there is provided a method of manufacturing a semiconductor device, including: forming a metal film containing carbon and nitrogen in a predetermined ratio on a substrate by: (a) forming a first layer containing a metal element and one of carbon and nitrogen M times and (b) forming a second layer containing the metal element, nitrogen and carbon N times, wherein (a) and (b) are alternately performed L times (where M, N and L are natural numbers).

<Supplementary Note 22>

According to another aspect of the present invention, there is provided a method of manufacturing a semiconductor device, including: forming a metal film containing carbon and nitrogen in a predetermined ratio on a substrate by: (a) supplying a first source containing a metal element and a second source containing one of carbon and nitrogen alternately M times to the substrate and (b) supplying a third source containing carbon, a fourth source containing the metal element and a fifth source containing nitrogen N times, wherein (a) and (b) are alternately performed L times (where M, N and L are natural numbers).

<Supplementary Note 23>

In the method of any one of Supplementary notes 21 and 22, preferably, M, N and L are determined by a ratio of at least one of nitrogen and carbon contained in the metal film.

<Supplementary Note 24>

In the method of Supplementary note 21, preferably, the second layer includes a second metal element different from the metal element.

<Supplementary Note 25>

In the method of Supplementary note 22, preferably, the fourth source includes a second metal element different from the metal element.

<Supplementary Note 26>

In the method of any one of Supplementary notes 21 through 25, the metal film is film-formed on a high-k dielectrics film formed on the substrate.

<Supplementary Note 27>

In the method of any one of Supplementary notes 21 through 26, the metal element includes one selected from the group consisting of titanium, tantalum, hafnium, zirconium, molybdenum and tungsten.

<Supplementary Note 28>

In the method of any one of Supplementary notes 24 and 25, the second metal element includes aluminium.

<Supplementary Note 29>

In the method of Supplementary note 22, the first source and the fourth source includes $TiCl_4$.

<Supplementary Note 30>

In the method of Supplementary note 25, the third source includes trimethylaluminium (TMA).

<Supplementary Note 31>

In the method of any one of Supplementary notes 21 through 30, the metal element includes titanium and a work function of the metal film is a value between a work function of TiAlC and one of a work function of TiN and a work function of TiAlN.

<Supplementary Note 32>

In the method of any one of Supplementary notes 24 and 25, the metal element includes titanium, the second metal element includes aluminium, and a work function of the metal film is a value between a work function of TiAlC and one of a work function of TiN and a work function of TiAlN.

<Supplementary Note 33>

According to another aspect of the present invention, there is provided a substrate processing method including: forming a metal film containing carbon and nitrogen in a predetermined ratio on a substrate by: (a) forming a first layer containing a metal element and one of carbon and nitrogen M times and (b) forming a second layer containing the metal element, nitrogen and carbon N times, wherein (a) and (b) are alternately performed L times (where M, N and L are natural numbers).

<Supplementary Note 34>

According to another aspect of the present invention, there is provided a substrate processing method including: forming a metal film containing carbon and nitrogen in a predetermined ratio on a substrate by: (a) supplying a first source containing a metal element and a second source containing one of carbon and nitrogen alternately M times to the substrate and (b) supplying a third source containing carbon, a fourth source containing the metal element and a fifth source containing nitrogen N times, wherein (a) and (b) are alternately performed L times (where M, N and L are natural numbers).

<Supplementary Note 35>

In the substrate processing method of any one of Supplementary notes 33 and 34, preferably, M, N and L are determined by a ratio of at least one of nitrogen and carbon contained in the metal film.

<Supplementary Note 36>

According to another aspect of the present invention, there is provided a substrate processing apparatus including: a process chamber configured to accommodate a substrate; a metal-containing source supply system connected to the process chamber and configured to supply a metal-containing source containing a metal element to the substrate accommodated in the process chamber; a nitrogen-containing source supply system connected to the process chamber and configured to supply a nitrogen-containing source to the substrate accommodated in the process chamber; a carbon-containing source supply system connected to the process chamber and configured to supply a carbon-containing source to the substrate accommodated in the process chamber; and a control unit connected to the metal-containing source supply system, the nitrogen-containing source supply system and the carbon-containing source supply system and configured to control the metal-containing source supply system, the nitrogen-containing source supply system and the carbon-containing source supply system to form a metal film containing nitrogen and carbon in a predetermined ratio on the substrate accommodated in the process chamber by: (a) supplying the metal-containing source and one of the nitrogen-containing source and the carbon-containing source alternately M times to the substrate accommodated in the process chamber and (b) supplying the metal-containing source, the nitrogen-containing source and the carbon-containing source N times, wherein (a) and (b) are alternately performed L times (where M, N and L are natural numbers).

<Supplementary Note 37>

In the substrate processing apparatus of Supplementary note 36, preferably, M, N and L are determined by a ratio of at least one of nitrogen and carbon contained in the metal film.

<Supplementary Note 38>

According to another aspect of the present invention, there is provided a program causing a computer to perform: forming a metal film containing carbon and nitrogen in a predetermined ratio on a substrate by: (a) forming a first layer containing a metal element and one of carbon and nitrogen M times and (b) forming a second layer containing the metal element, nitrogen and carbon N times, wherein (a) and (b) are alternately performed L times (where M, N and L are natural numbers).

<Supplementary Note 39>

In the program of Supplementary note 39, preferably, M, N and L are determined by a ratio of at least one of nitrogen and carbon contained in the metal film.

<Supplementary Note 40>

According to another aspect of the present invention, there is provided a non-transitory computer-readable recording medium storing a program causing a computer to perform: forming a metal film containing carbon and nitrogen in a predetermined ratio on a substrate by: (a) forming a first layer containing a metal element and one of carbon and nitrogen M times and (b) forming a second layer containing the metal element, nitrogen and carbon N times, wherein (a) and (b) are alternately performed L times (where M, N and L are natural numbers).

<Supplementary Note 41>

In the non-transitory computer-readable recording medium of Supplementary note 40, preferably, M, N and L are determined by a ratio of at least one of nitrogen and carbon contained in the metal film.

As described above, the present invention is applicable to, for example, a method of manufacturing a semiconductor device, a substrate processing apparatus configured to process a substrate such as a semiconductor wafer or a glass substrate, etc.

What is claimed is:

1. A method of manufacturing a semiconductor device, comprising:
   (a) forming a titanium nitride layer on a substrate by supplying a first source containing titanium and a second source containing nitrogen to the substrate;
   (b) forming a titanium aluminum carbonitride layer on the substrate by supplying the first source, the second source and a third source containing aluminum and carbon to the substrate;
   (c) forming a laminated film on the substrate by performing (a) and (b); and
   (d) adjusting ratios of titanium, nitrogen, aluminum and carbon in the laminated film based on how many times (a) and (b) are performed.

2. The method of claim 1, wherein, in (b), the first source is supplied after supplying the third source and the second source is supplied after supplying the first source.

3. The method of claim 1, wherein the first source and the second source are alternately supplied X times in (a) where X is a natural number, and
   the third source, the first source and the second source are sequentially supplied Y times in (b) where Y is a natural number.

4. The method of claim 1, wherein (a) and (b) are alternately performed Z times in (c) where Z is a natural number.

5. The method of claim 3, wherein (a) and (b) are alternately performed Z times in (c) where Z is a natural number.

6. The method of claim 3, wherein at least one of X and Y is adjusted in (d) such that a work function of the laminated film is within a predetermined range.

7. The method of claim 5, wherein at least one of X, Y and Z is adjusted in (d) such that a work function of the laminated film is within a predetermined range.

8. The method of claim 5, wherein X, Y and Z are adjusted in (d) such that a work function of the laminated film is within a predetermined range.

9. The method of claim 5, wherein a product of X and Y and a product of Y and Z are adjusted in (d) such that a work function of the laminated film is within a predetermined range.

10. The method of claim 7, wherein X, Y and Z are adjusted in (d) such that the work function of the laminated film is within a range from 4.52 eV to 4.68 eV.

11. The method of claim 7, wherein (d) is performed such that a ratio of carbon to nitrogen in the laminated film is equal to or less than ¼.

12. The method of claim 7, wherein (d) is performed such that a ratio of carbon to nitrogen in the laminated film is equal to or less than ⅙.

13. The method of claim 7, wherein (d) is performed such that a ratio of carbon to nitrogen in the laminated film is equal to or less than 1/10.

14. The method of claim 8, wherein X is adjusted in (a) such that a thickness of the titanium nitride layer is within a range from 0.03 nm to 20 nm,
   Y is adjusted in (b) such that a thickness of the titanium aluminum carbonitride layer is within a range from 0.1 nm to 20 nm, and
   Z is adjusted in (c) such that a thickness of the laminated film is within a range from 1.0 nm to 200 nm.

* * * * *